(12) United States Patent
Anderson et al.

(10) Patent No.: US 8,076,204 B2
(45) Date of Patent: Dec. 13, 2011

(54) GRAPHENE-BASED TRANSISTOR

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/765,483

(22) Filed: Apr. 22, 2010

(65) Prior Publication Data

US 2010/0200840 A1 Aug. 12, 2010

Related U.S. Application Data

(62) Division of application No. 11/778,209, filed on Jul. 16, 2007, now Pat. No. 7,732,859.

(51) Int. Cl.
*H01L 21/336* (2006.01)

(52) U.S. Cl. .............. 438/283; 257/328; 257/E29.264

(58) Field of Classification Search .......... 438/283; 257/328, E29.264
See application file for complete search history.

(56) References Cited

U.S. PATENT DOCUMENTS

| | | | |
|---|---|---|---|
| 5,874,341 A * | 2/1999 | Gardner et al. | 438/301 |
| 6,620,669 B2 * | 9/2003 | Hijzen et al. | 438/206 |
| 6,869,581 B2 | 3/2005 | Kishi et al. | |
| 6,998,676 B2 | 2/2006 | Kondo et al. | |
| 7,015,142 B2 | 3/2006 | DeHeer et al. | |
| 7,071,258 B1 | 7/2006 | Jang et al. | |
| 2004/0253820 A1 * | 12/2004 | DeHeer et al. | 438/689 |
| 2006/0099750 A1 | 5/2006 | DeHeer et al. | |
| 2007/0187694 A1 * | 8/2007 | Pfeiffer | 257/76 |
| 2008/0006908 A1 | 1/2008 | Lin et al. | |

* cited by examiner

*Primary Examiner* — Steven Fulk
(74) *Attorney, Agent, or Firm* — Scully, Scott, Murphy & Presser, P.C.; Richard M. Kotulak, Esq.

(57) ABSTRACT

A graphene layer is formed on a surface of a silicon carbide substrate. A dummy gate structure is formed over the fin, in the trench, or on a portion of the planar graphene layer to implant dopants into source and drain regions. The dummy gate structure is thereafter removed to provide an opening over the channel of the transistor. Threshold voltage adjustment implantation may be performed to form a threshold voltage implant region directly beneath the channel, which comprises the graphene layer. A gate dielectric is deposited over a channel portion of the graphene layer. After an optional spacer formation, a gate conductor is formed by deposition and planarization. The resulting graphene-based field effect transistor has a high carrier mobility due to the graphene layer in the channel, low contact resistance to the source and drain region, and optimized threshold voltage and leakage due to the threshold voltage implant region.

20 Claims, 25 Drawing Sheets

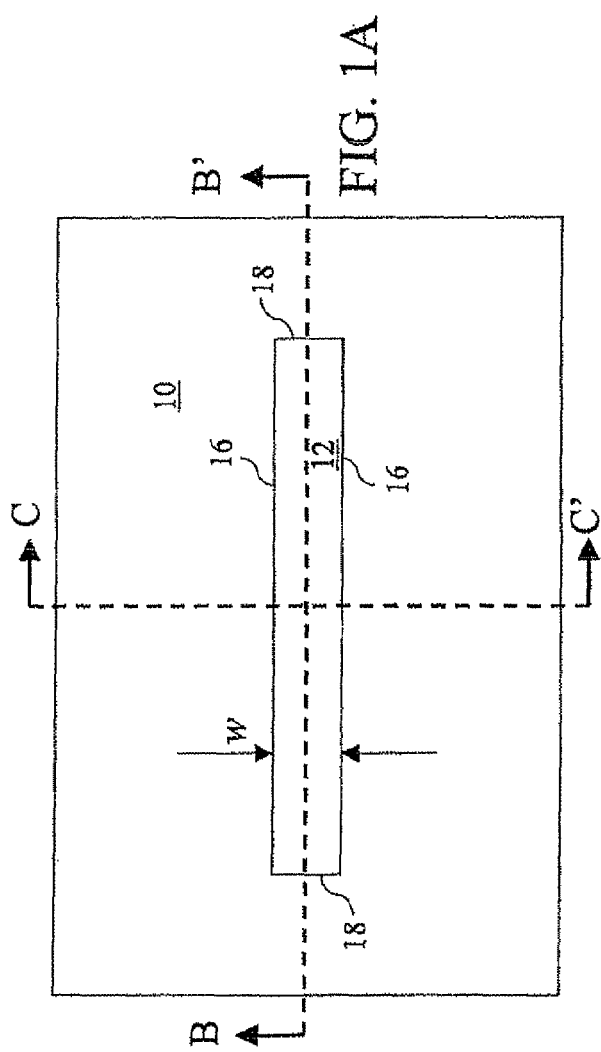
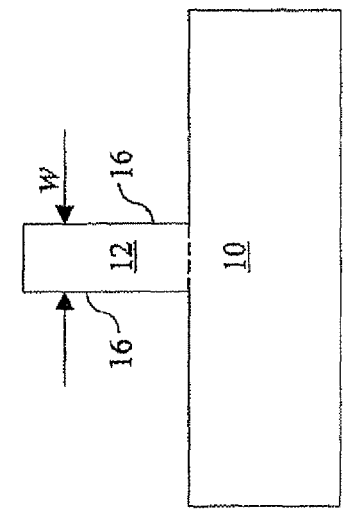
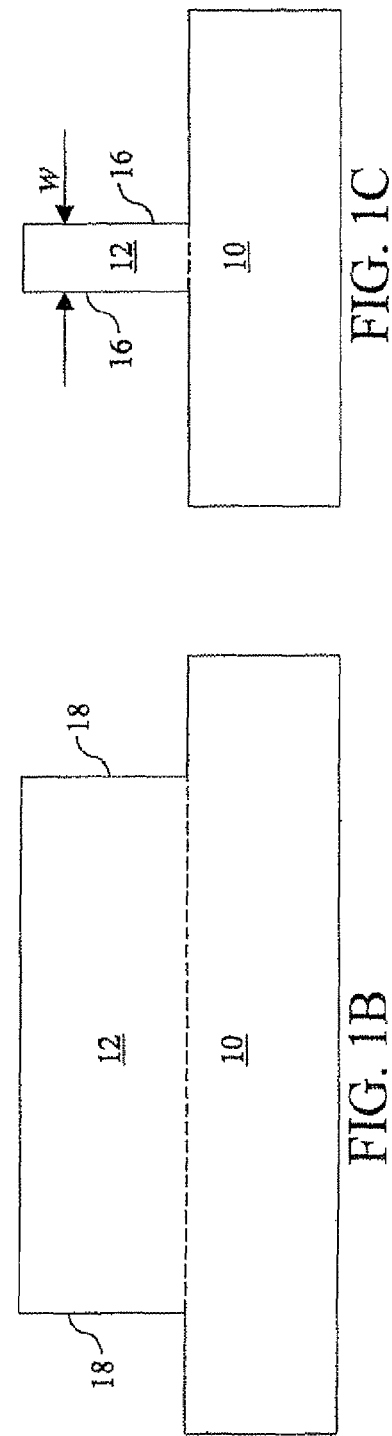

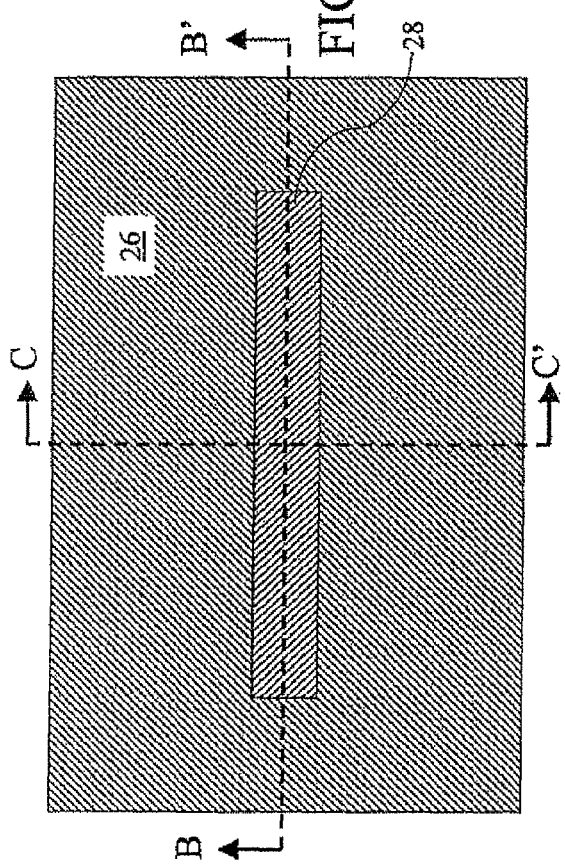
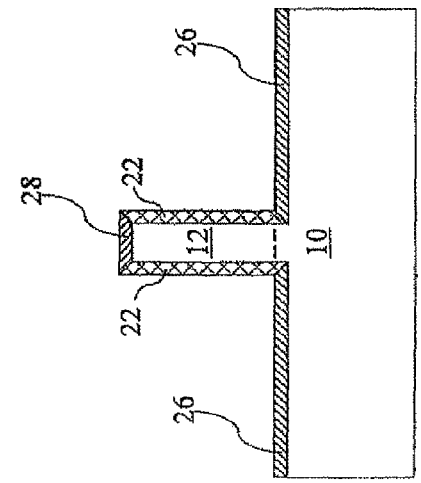
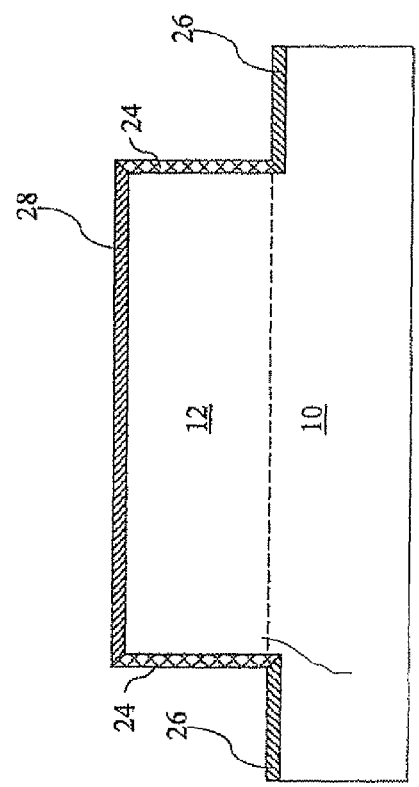
FIG. 2A
FIG. 2B
FIG. 2C

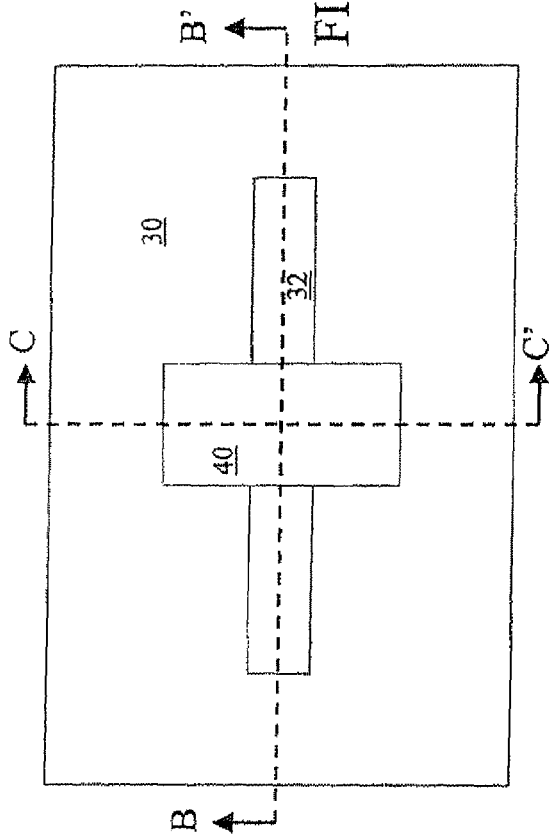
FIG. 4A
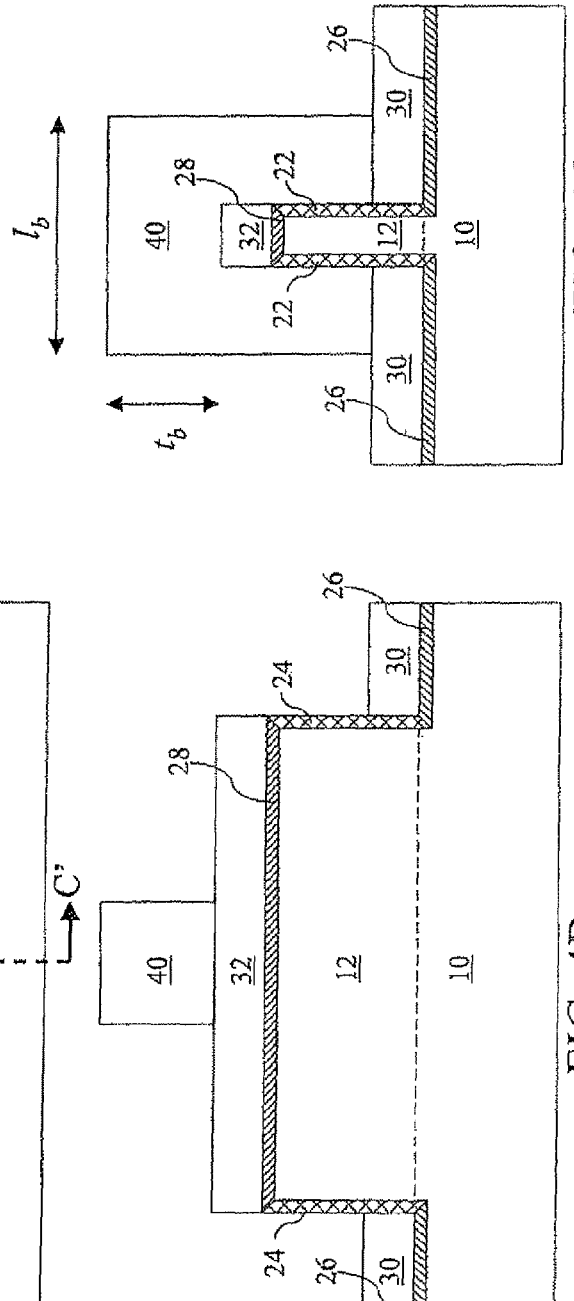
FIG. 4B
FIG. 4C

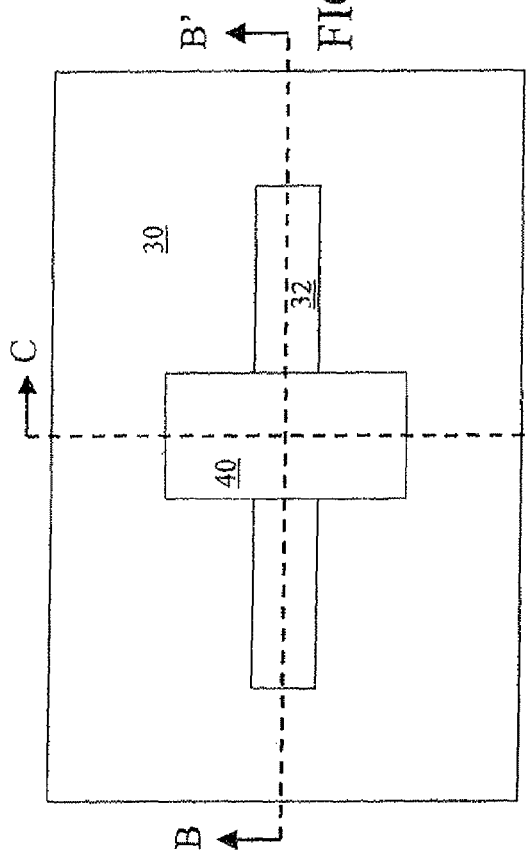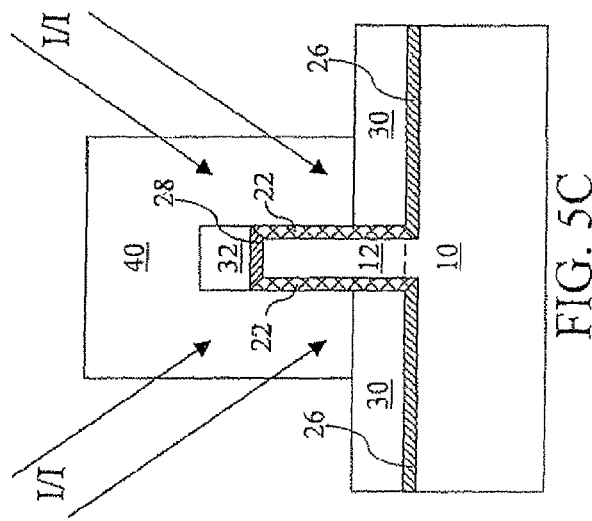
FIG. 5A
FIG. 5B
FIG. 5C

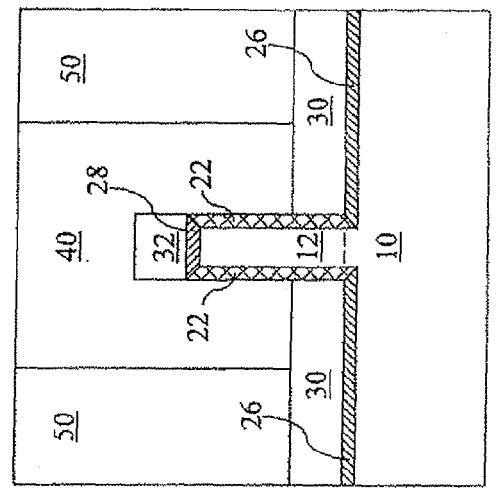
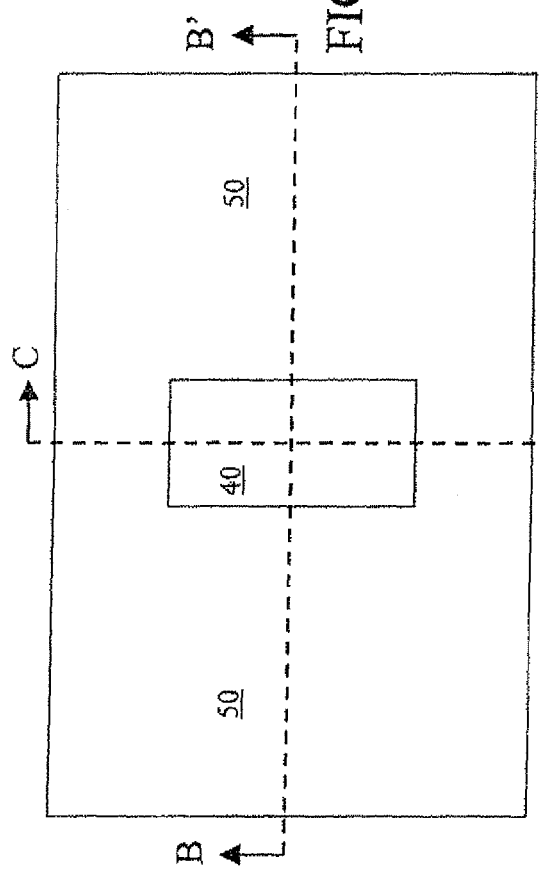
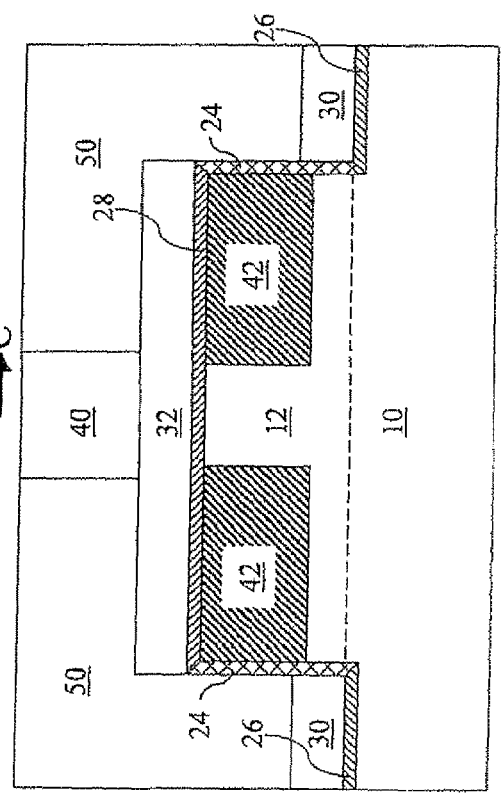
FIG. 6A
FIG. 6B
FIG. 6C

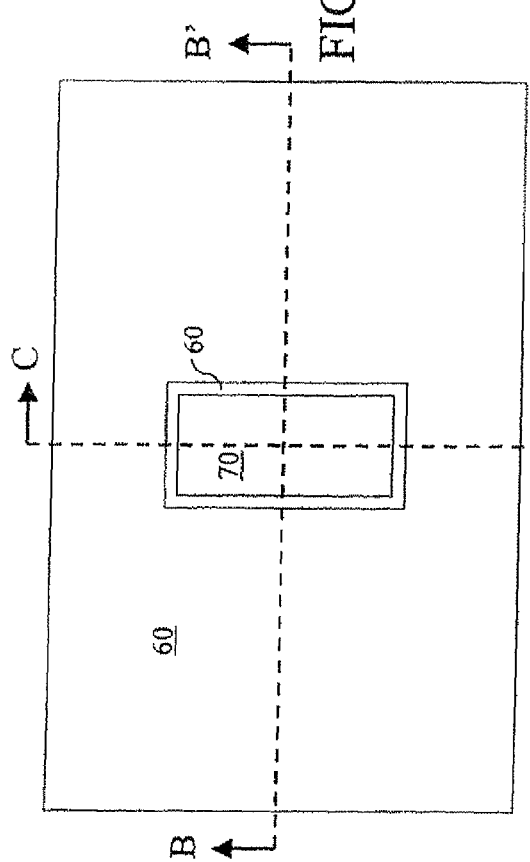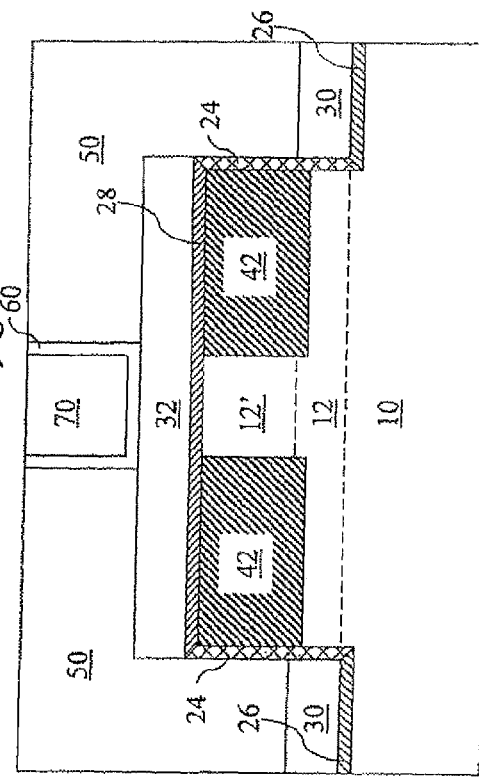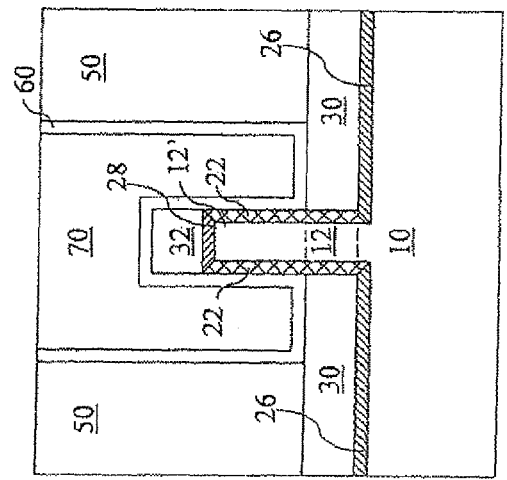
FIG. 9A
FIG. 9B
FIG. 9C

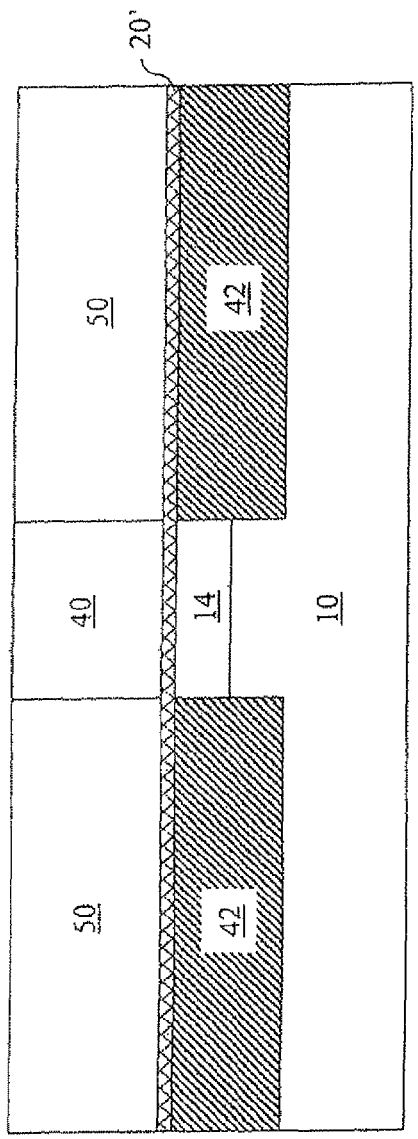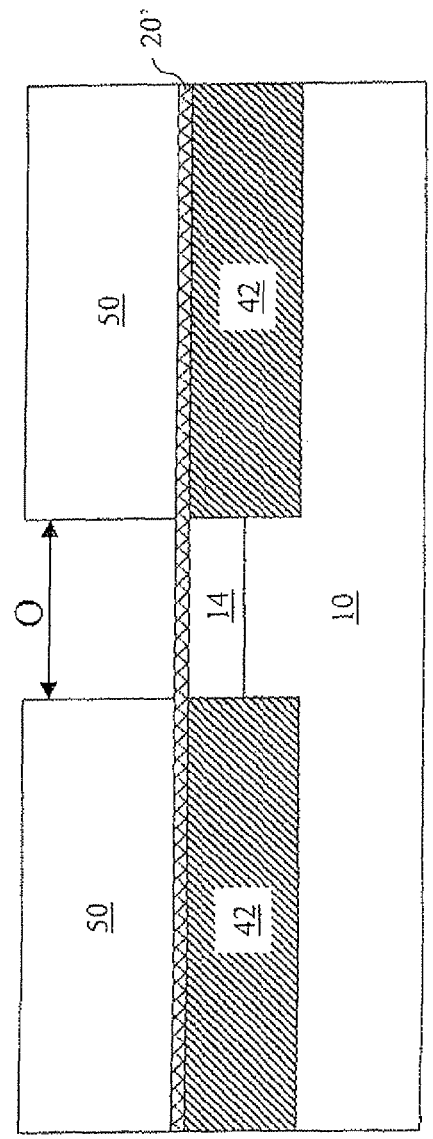
FIG. 26
FIG. 27

GRAPHENE-BASED TRANSISTOR

CROSS REFERENCE TO RELATED APPLICATION

This application is a divisional of U.S. patent application Ser. No. 11/778,209, filed Jul. 16, 2007 the entire content and disclosure of which is incorporated herein by reference.

FIELD OF THE INVENTION

The present invention relates to semiconductor structures, and particularly to graphene-based transistors and method of manufacturing the same.

BACKGROUND OF THE INVENTION

Graphene refers to a two-dimensional planar sheet of carbon atoms arranged in a hexagonal benzene-ring structure. A free-standing graphene structure is theoretically stable only in a two-dimensional space, which implies that a planar graphene structure does not exist in a free state, being unstable with respect to formation of curved structures such as soot, fullerenes, and nanotubes. However, a two-dimensional graphene structure has been demonstrated on a surface of a three-dimensional structure, for example, on the surface of a SiC crystal.

Structurally, graphene has hybrid orbitals formed by $sp^2$ hybridization. In the $sp^2$ hybridization, the 2s orbital and two of the three 2p orbitals mix to form three $sp^2$ orbitals. The one remaining p-orbital forms a pi-bond between the carbon atoms. Similar to the structure of benzene, the structure of graphene has a conjugated ring of the p-orbitals which exhibits a stabilization that is stronger than would be expected by the stabilization of conjugation alone, i.e., the graphene structure is aromatic. Unlike other allotropes of carbon such as diamond, amorphous carbon, carbon nanofoam, or fullerenes, graphene is not an allotrope of carbon since the thickness of graphene is one atomic carbon layer i.e., a sheet of graphene does not form a three dimensional crystal. However, multiple sheets of graphene may be stacked. A typical graphene "layer" may comprise a single sheet or multiple sheets of graphene, for example, between 1 sheet and 10 sheets.

Graphene has an unusual band structure in which conical electron and hole pockets meet only at the K-points of the Brillouin zone in momentum space. The energy of the charge carriers, i.e., electrons or holes, has a linear dependence on the momentum of the carriers. As a consequence, the carriers behave as relativistic Dirac-Fermions having an effective mass of zero and moving at the effective speed of light of $c_{\mathit{eff}} \cong 10^6$ m/sec. Their relativistic quantum mechanical behavior is governed by Dirac's equation. As a consequence, graphene sheets have a large carrier mobility of up to 60,000 $cm^2$/V-sec at 4K. At 300K, the carrier mobility is about 15,000 $cm^2$/V-sec. Also, quantum Hall effect has been observed in graphene sheets.

A perfect graphene structure consists exclusively of hexagonal cells. Any pentagonal or heptagonal cell constitutes a structural defect. It should be noted that defects in the graphene structure converts a graphene layer into other carbon-based structures such as a large fullerenes and nanotubes, etc. In particular, carbon nanotubes may be considered as graphene sheets rolled up into nanometer-sized cylinders due to the presence of defects. A fullerene, also known as a "buckyball" having a pattern similar to the pattern on a soccer ball, would be formed if some hexagons are substituted with pentagons. Likewise, insertion of an isolated heptagon causes the sheet to become saddle-shaped. Controlled addition of pentagons and heptagons would allow a wide variety of shapes to be formed.

Graphene layers may be grown by solid state graphitization, i.e., by sublimating silicon atoms from a surface of silicon carbide surface, such as a (001) surface. At about 1,150° C., a complex pattern of surface reconstruction begins to appear at an initial stage of graphitization. Typically, a higher temperature is needed to form a graphene layer.

Formation of a graphene layer on another material is known in the art. For example, single or several layers of graphene may be formed on a silicon carbide (SiC) substrate by sublimation decomposition of a surface layer of a silicon carbide material.

U.S. Pat. Nos. 7,071,258 to Jang et al. and 6,869,581 to Kishi et al. describe known properties and methods of forming graphene layers, the contents of which are herein incorporated by reference. Further, U.S. Patent Application Publication No. 2006/0099750 to DeHeer et al. and U.S. Pat. No. 7,015,142 to DeHeer et al. describe methods of forming graphene layers, the contents of which are herein incorporated by reference.

Graphene displays many other advantageous electrical properties such as electronic coherence at near room temperature and quantum interference effects. Ballistic transport properties in small scale structures are also expected in graphene layers.

Therefore, there exists a need for a field effect transistor which utilizes the advantageous properties of graphene such as large carrier mobility and a method of manufacturing the same.

Further, there exists a need for a field effect transistor that is compatible with standard complementary metal oxide semiconductor (CMOS) processing technologies and manufacturable with minimum number of deviated processing steps.

SUMMARY OF THE INVENTION

The present invention addresses the needs described above by providing field effect transistor structures employing a graphene layer for the channel and having source and drain regions formed by a doped silicon carbide that adjoins the graphene layer. The field effect transistor further comprises a threshold voltage adjustment region underneath the channel to control the leakage current.

Specifically, a graphene layer is formed on a surface of a silicon carbide substrate. A fin or a trench may be formed on the silicon carbide substrate prior to the formation of the graphene layer. Alternatively, a planar surface may be employed to form the graphene layer. A dummy gate structure is formed over the fin, in the trench, or on a portion of the planar graphene layer to implant dopants into source and drain regions. In the case of the fin and planar structures, a dielectric layer is deposited and planarized. The dummy gate structure is thereafter removed to provide an opening over the channel of the transistor. Threshold voltage adjustment implantation may be performed to form a threshold voltage implant region directly beneath the channel, which comprises the graphene layer. A gate dielectric is deposited over a channel portion of the graphene layer. After an optional spacer formation, a gate conductor is formed by deposition and planarization. The resulting graphene-based field effect transistor has a high carrier mobility due to the graphene layer in the channel, low contact resistance to the source and drain region, and optimized threshold voltage and leakage due to the threshold voltage implant region.

According to a first embodiment of the present invention, a field effect transistor comprises:

a silicon carbide fin located directly on a silicon carbide substrate;

a pair of graphene layers located on a pair of sidewalls of the silicon carbide fin;

doped source and drain regions located beneath the pair of graphene layers and within the silicon carbide fin;

a gate dielectric directly contacting the pair of graphene layers; and a gate electrode directly contacting the gate dielectric.

The field effect transistor may further comprise a threshold voltage adjustment implant region located within the silicon carbide fin and abutting the pair of graphene layers.

The field effect transistor may further comprise:

a first planar graphene layer located on a top surface of the silicon carbide substrate;

a second planar graphene layer located on a top surface of the silicon carbide fin;

a first insulator layer directly contacting the first planar graphene layer; and a second insulator layer directly contacting the second planar graphene layer, wherein the first insulator layer and the second insulator layer comprise the same material.

The field effect transistor may further comprise a gate level dielectric having a top surface which is substantially coplanar with the gate electrode. The gate level dielectric may have at least one sidewall which abuts the gate dielectric.

According to a second embodiment of the present invention, a field effect transistor comprises:

a trench having a substantially flat bottom surface and a pair of trench sidewalls and located within a silicon carbide substrate;

a graphene layer located directly on the substantially flat bottom surface of the trench;

doped source and drain regions located on the pair of trench sidewalls and within the silicon carbide substrate;

a gate dielectric directly contacting the graphene layer; and a gate electrode directly contacting the gate dielectric.

The field effect transistor may further comprise a threshold voltage adjustment implant region located directly beneath the graphene layer and within the silicon carbide substrate.

The field effect transistor may further comprise at least one halo region abutting the threshold voltage adjustment implant region and one of the doped source and drain regions.

The field effect transistor may further comprise a dielectric spacer, wherein the gate dielectric contains at least a pair of substantially vertical sidewalls which abut the dielectric spacer.

According to a third embodiment of the present invention, a field effect transistor comprises:

a planar graphene layer located directly on a surface of a silicon carbide substrate;

doped source and drain regions located beneath the graphene layer and within the silicon carbide substrate;

a gate dielectric directly contacting the planar graphene layer; and a gate electrode directly contacting the gate dielectric.

The field effect transistor may further comprise a threshold voltage adjustment implant region located directly beneath the planar graphene layer and within the silicon carbide substrate.

The field effect transistor may further comprise a gate level dielectric having a top surface which is substantially coplanar with the gate electrode.

The field effect transistor may further comprise a dielectric spacer, wherein the gate dielectric contains at least a pair of substantially vertical sidewalls which abut the dielectric spacer.

According to another aspect of the present invention, a method of manufacturing a field effect transistor includes:

providing a silicon carbide substrate;

forming at least one pair of sidewalls conducive to graphitization on said silicon carbide substrate;

performing a solid state graphitization on exposed surfaces of said silicon carbide substrate including said at least one pair of sidewalls, wherein at least one graphene layer is formed on said silicon carbide substrate, the at least one graphene layer contiguously extending, in order, through a first horizontal graphene layer, a first vertical graphene layer, a second horizontal graphene layer, a second vertical graphene layer, and a third horizontal graphene layer that is coplanar with said first horizontal graphene layer, wherein said second horizontal graphene layer is vertically offset from said first and third graphene layers, and said first and second vertical graphene layers are formed by graphitization of the at least one pair of sidewalls;

forming at least one graphene layer on the silicon carbide substrate;

forming an ion implantation blocking structure over a portion of the at least one graphene layer;

forming doped source and drain regions within the silicon carbide substrate;

removing the ion implantation blocking structure;

forming a gate dielectric over the portion of the at least one graphene layer; and forming a gate electrode directly on the gate dielectric layer.

The method may further comprising forming a threshold voltage adjustment implant region beneath the at least one graphene layer.

The method may further comprise forming a silicon carbide fin directly on the silicon carbide substrate, wherein the at least one graphene layer is a pair of graphene layers on a pair of sidewalls of the silicon carbide fin.

The method may further comprise forming a trench in the silicon carbide substrate, wherein the at least one graphene layer is a graphene layer on a substantially flat bottom surface of the trench.

The method may further comprise forming a gate spacer, wherein the gate dielectric contains at least one substantially vertical portion that abuts the gate spacer.

The method may further comprise forming a gate level dielectric over the silicon carbide substrate in an area outside the ion implantation blocking structure.

The gate electrode may be formed by depositing a gate electrode material and planarizing the gate electrode material employing a stopping layer which is selected from the group consisting of the gate dielectric, a surface of the silicon carbide substrate, and a gate level dielectric.

BRIEF DESCRIPTION OF THE DRAWINGS

According to yet another aspect of the present invention, a method of manufacturing a field effect transistor includes:

providing a silicon carbide substrate;

forming at least one pair of sidewalls not conducive to graphitization on the silicon carbide substrate;

performing solid state graphitization on exposed surfaces of the silicon carbide substrate including the at least one pair of sidewalls, wherein a contiguous carbon-containing layer is formed on the silicon carbide substrate, the contiguous carbon-containing layer contiguously extending, in order, through a first horizontal graphene layer, a first vertical carbon layer having a structural arrangement different from a graphene layer, a second horizontal graphene layer, a second vertical carbon layer having a structural arrangement different from a graphene layer, and a third horizontal graphene layer that is coplanar with the first horizontal graphene layer, wherein the second horizontal graphene layer is vertically offset from the first and third graphene layers, and the first and second vertical graphene layer are formed by graphitization of the at least one pair of sidewalls;

forming an ion implantation blocking structure over a portion of the at least one graphene layer;

forming doped source and drain regions within the silicon carbide substrate;

removing the ion implantation blocking structure;

forming a gate dielectric over the portion of the at least one graphene layer; and forming a gate electrode directly on the gate dielectric layer.

FIGS. 1A-11A are sequential top-down views of a first field effect transistor structure according to a first embodiment of the present invention during manufacturing steps.

FIGS. 1B-10B and FIGS. 1C-10C are sequential vertical cross-sectional views of the first field effect transistor structure according to the first embodiment of the present invention along the plane B-B' and C-C', respectively, of the corresponding figure with the same numeric label and the suffix "A."

Figure 11A:
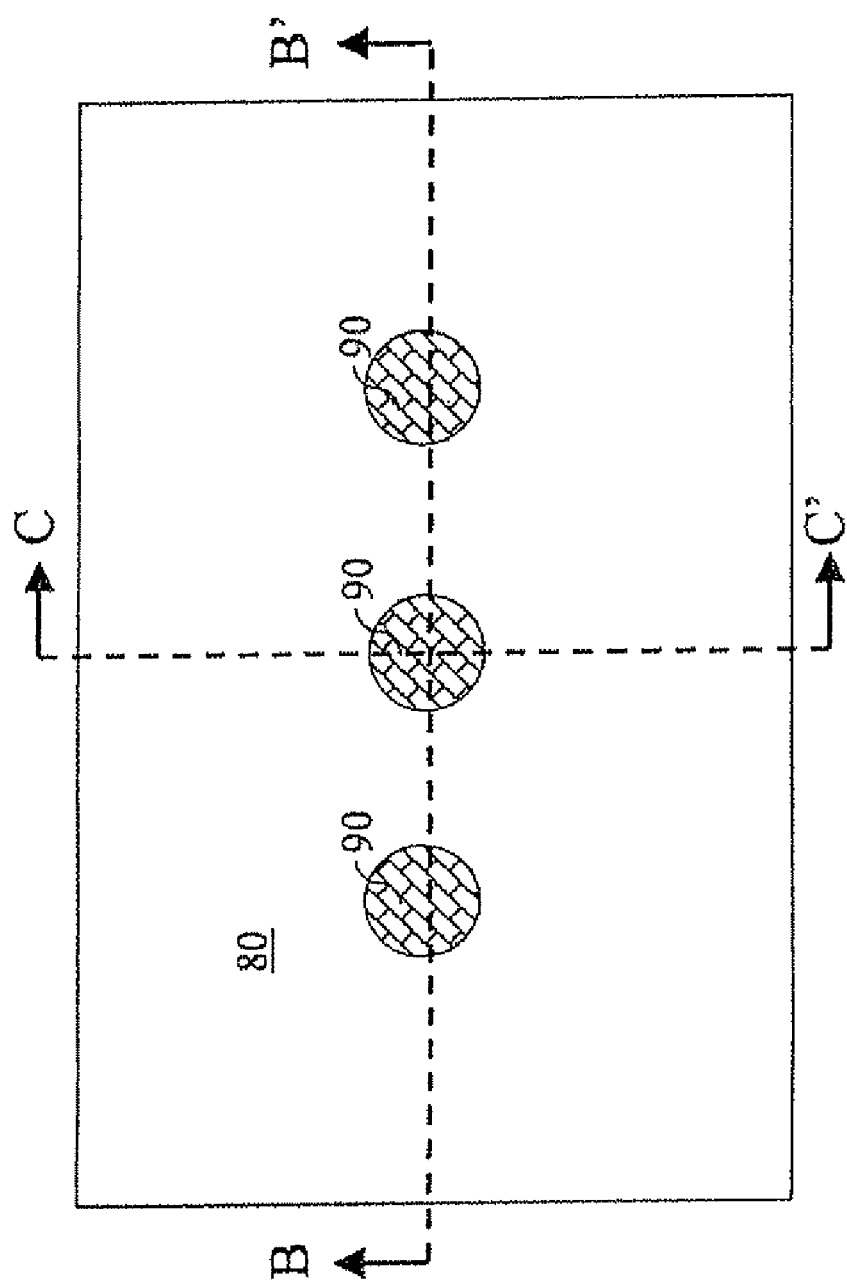
Figure 11C:
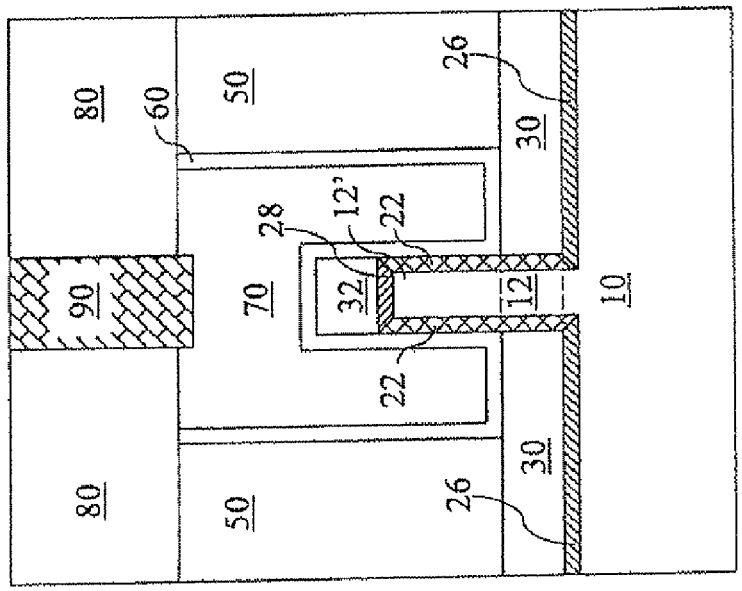
Figure 11B:
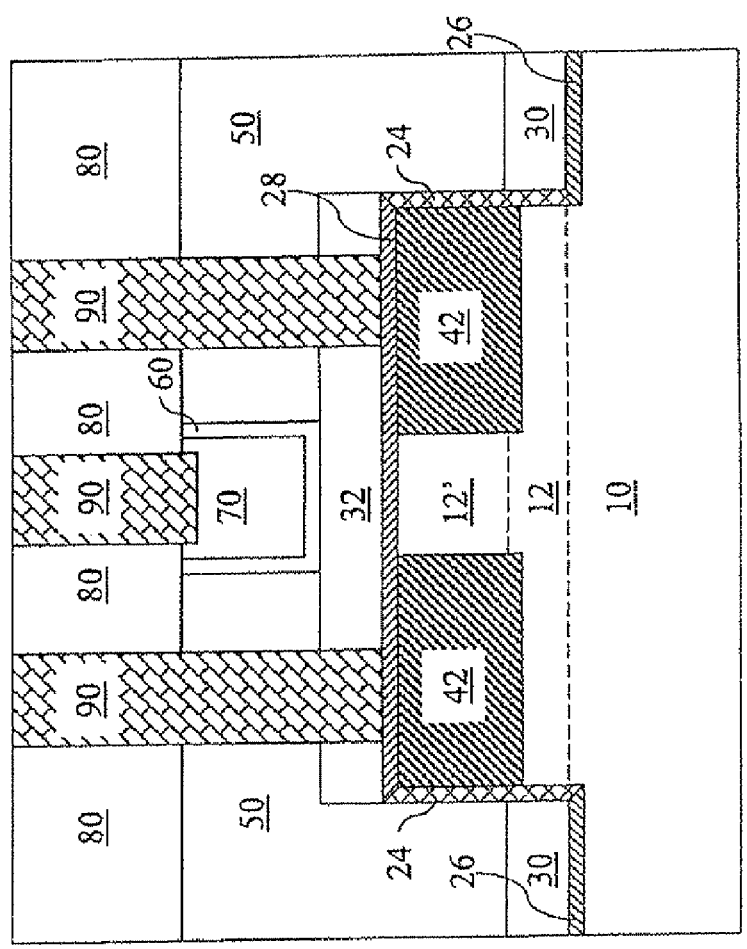

FIGS. 11A-11C are views of an alternate first field effect transistor structure according to the first embodiment of the present invention.

FIGS. 12-21 are sequential vertical cross-sectional views of a second field effect transistor structure according to a second embodiment of the present invention.

Figure 22:
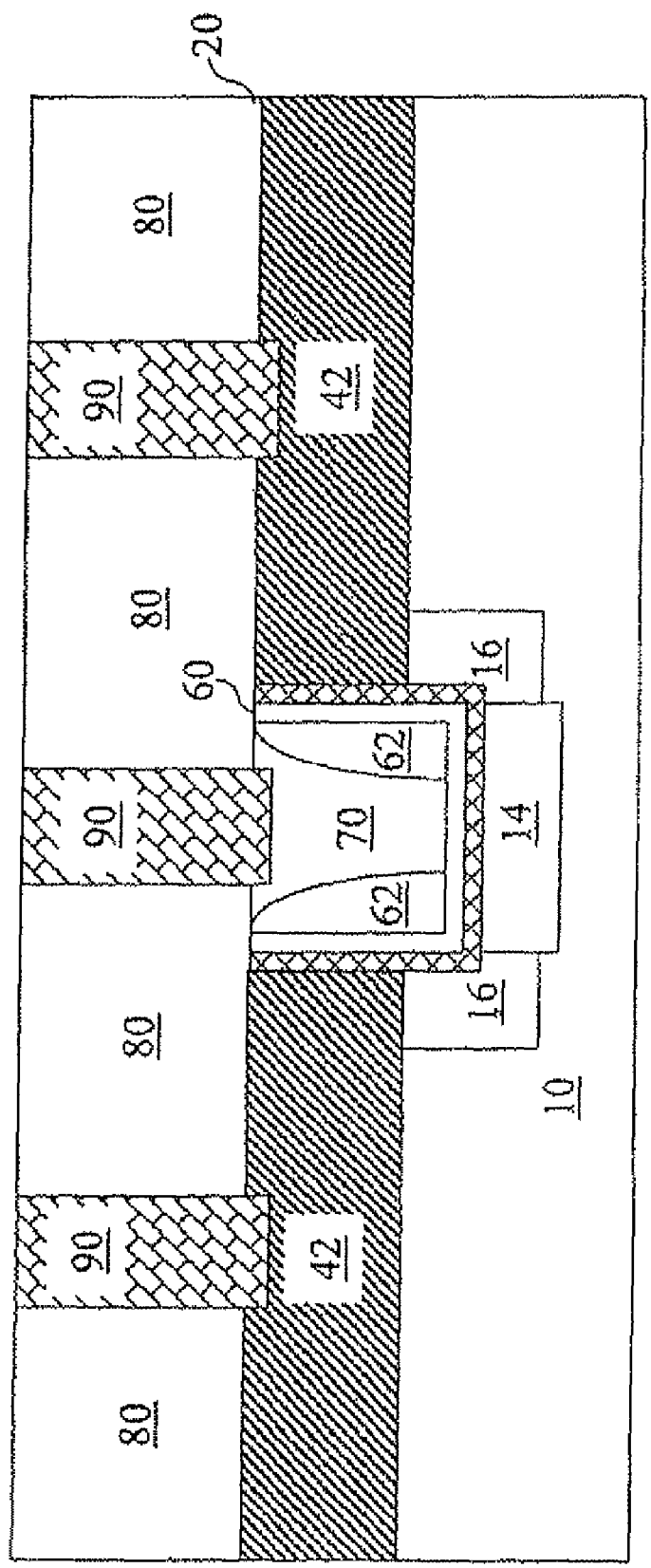
Figure 23:
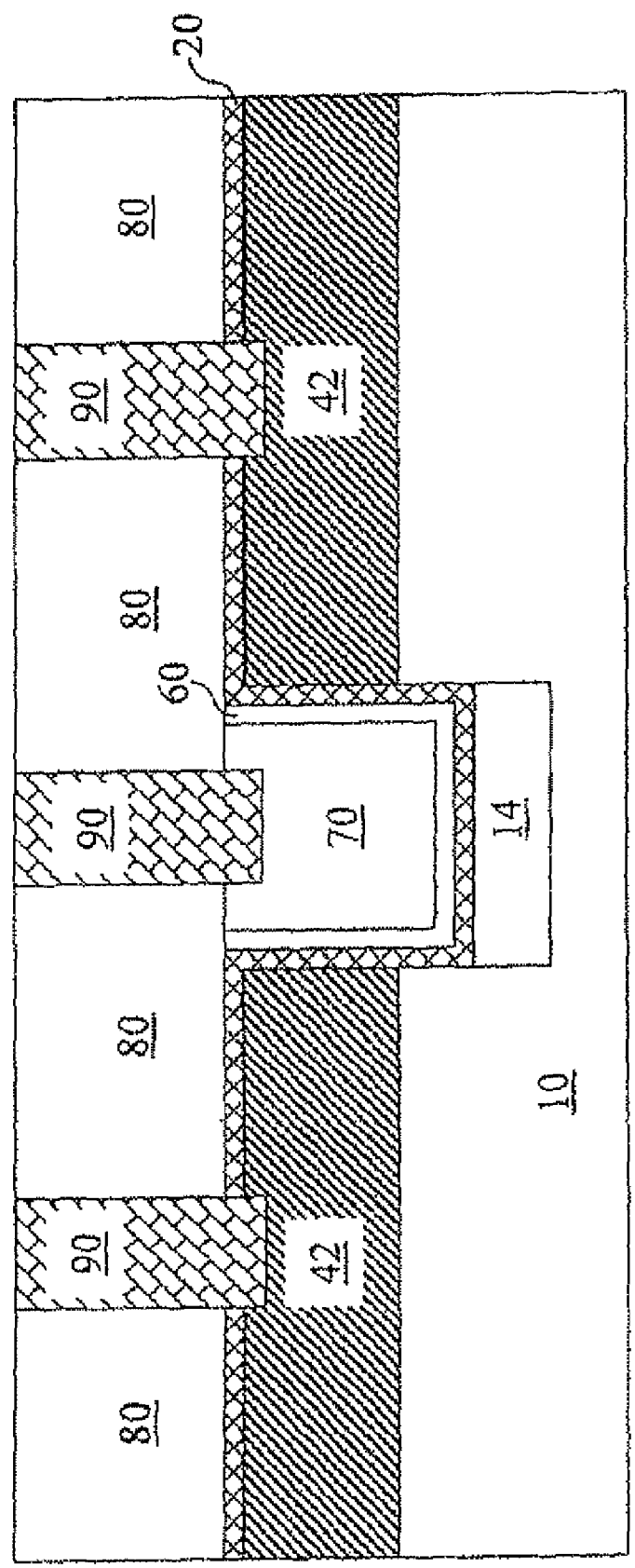

FIGS. 22 and 23 are views of alternate second field effect transistor structures according to the second embodiment of the present invention.

FIGS. 24-30 are sequential vertical cross-sectional views of a third field effect transistor structure according to a third embodiment of the present invention.

Figure 31:
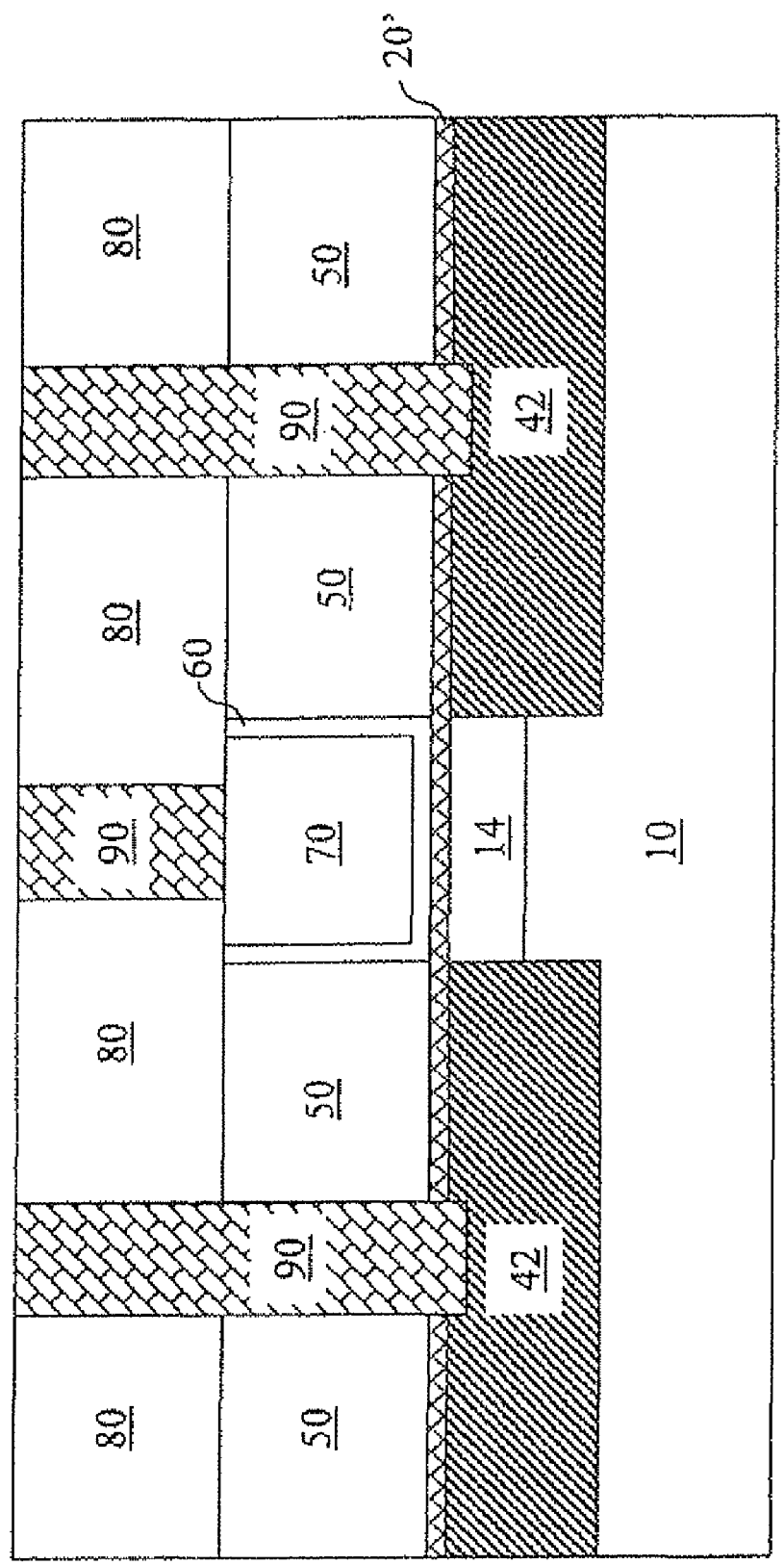

FIG. 31 is a vertical cross-sectional view of an alternate third field effect transistor structure according to the third embodiment of the present invention.

DETAILED DESCRIPTION OF THE INVENTION

As stated above, the present invention relates to graphene-based transistors and methods of manufacturing the same, which are now described in detail with accompanying figures. It is noted that like and corresponding elements are referred to by like reference numerals.

According to a first embodiment of the present invention, a silicon carbide fin 12 formed on a silicon carbide substrate 10 is shown in FIGS. 1A-1C. The silicon carbide fin 12 is formed out of the silicon carbide substrate 10 by lithographic patterning and etching. For example, a photoresist (not shown) may be applied over a top surface of a planar initial silicon carbide substrate (not shown). After a lithographic patterning of the photoresist, the pattern in the photoresist is transferred into the planar initial silicon carbide substrate to form the silicon carbide fin 12 and the silicon carbide substrate 10 underneath. The portion of the silicon carbide substrate 10 that is covered by the photoresist corresponds to the silicon carbide fin 12. The interface between the silicon carbide fin 12 and the silicon carbide substrate 10 is marked by dotted lines in FIGS. 1B and 1C.

Preferably, the silicon carbide fin 12 comprises a first pair of sidewalls 16 that are substantially parallel to each other and a second pair of sidewalls 18 that are substantially parallel to each other. The separation between the first pair of sidewalls 16 is less than the separation between the second pair of sidewalls 18. The distance between the first pair of sidewalls 16 is the width w of the silicon carbide fin 12.

Preferably, the width w of the silicon carbide fin 12 is on the order of a critical dimension of a lithography tool which is used to pattern the silicon carbide fin 12. In other words, the width w of the silicon carbide fin 12 is maintained as narrow as possible to take advantage of a dual gate geometry that is enabled by the fin geometry. The crystallographic orientations of the silicon carbide substrate 10 are chosen such that the first pair of sidewalls 16 of the silicon carbide fin 12 is conducive to formation of graphene layers. For example, the orientation of the first pair of sidewalls 16 may have the (0001) orientation of an alpha silicon carbide ($\alpha$-SiC) crystal, which has a hexagonal crystal structure. Other crystallographic surfaces of silicon carbide that are conducive to the formation of graphene layers, such as a (111) plane of a beta silicon carbide ($\beta$-SiC) crystal, which has a face centered cubic structure, may also be employed for the first pair of sidewalls 16 of the silicon carbide fin 12. Preferably, the second pair of sidewalls 18 of the silicon carbide fin 12 is also conducive to formation of a pair of graphene layers.

The height of the fin may be in the range from about 10 nm to about 1,000 nm, and preferably in the range from about 30 nm to about 300. The width w of the silicon carbide fin 12 may be in the range from about 10 nm to about 100 nm.

Referring to FIGS. 2A-2C, graphene layers are grown by solid state graphitization. Carbon atoms are sublimated during the graphitization process from the silicon carbide surfaces to form graphene layers. Specifically, a pair of graphene layers 22 is formed on the first pair of sidewalls 16. Another pair of graphene layers 24 may be formed on the second pair of sidewalls 18 if the crystallographic orientation of the second pair of sidewalls 18 is conducive to formation of graphene layers. Also, a first planar graphene layer 26 may be formed on a top surface of the silicon carbide substrate 10 if the crystallographic orientation of the top surface of the silicon carbide substrate 10 is conducive to formation of graphene layers. Likewise, a second planar graphene layer 28 may be formed on a top surface of the silicon carbide fin 12 if the crystallographic orientation of the top surface of the silicon carbide fin 12 is conducive to formation of graphene layers. It is noted herein that only the pair of graphene layers 22, which is formed on the first pair of sidewalls 16, is necessary to practice the present invention. Other graphene layers may or may not be present, or may be replaced with other phases of carbon material.

The pair of graphene layers 22 formed on the first pair of sidewalls 16 have a thickness in the range from about 1 monolayer to about 10 monolayers of carbon. The separation between the pair of graphene layers 22 is reduced from the width w of the original silicon carbide fin 12 by the total thickness of the pair of the graphene layers 22.

Figure 3C:
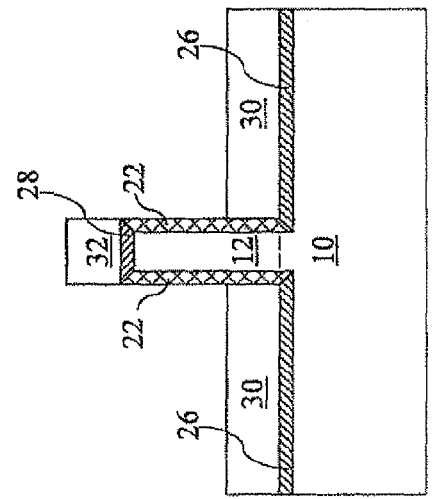
Figure 3A:
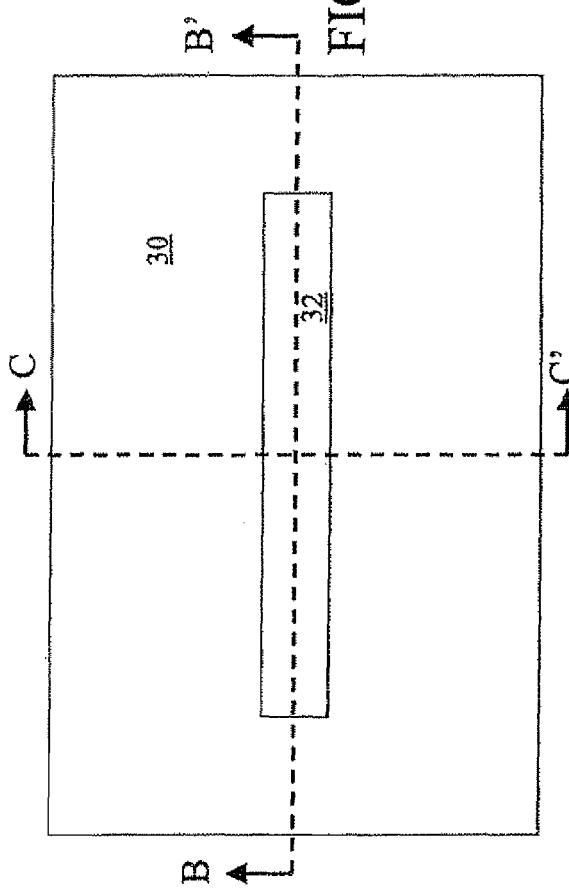
Figure 3B:
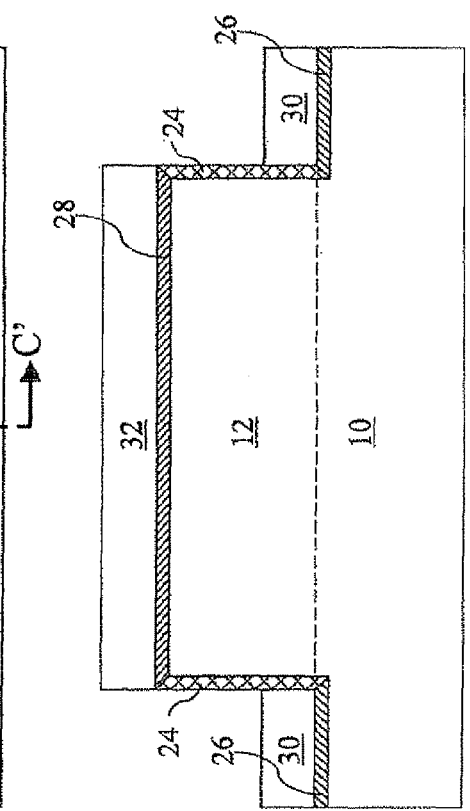

Referring to FIGS. 3A-3C, a non-conformal insulator layer is deposited on the silicon carbide substrate 10 and the silicon carbide fin 12. The non-conformal insulator layer may comprise silicon nitride, silicon oxide, high-k dielectric material, or a stack thereof. Due to the non-conformal nature of the deposited insulator layer, the thickness of the deposited insulator layer on vertical surfaces, including the sidewalls of the silicon carbide fin 12, is less than the thickness of the deposited insulator layer on horizontal surfaces. The deposited insulator layer material on the sidewalls is removed, for example, by an isotropic etch. At the end of the etch process, residual insulator material still remains over the first planar graphene layer 26 on the horizontal surface of the silicon carbide substrate 10 and the second planar graphene layer 28 on the top surface of the silicon carbide fin 12. In other words, a first insulator layer 30 directly contacts the first planar graphene layer 26 and a second insulator layer 32 directly contacts the second planar graphene layer 28. The first insulator layer 30 and the second insulator layer 32 comprise the same material.

Optionally, a threshold voltage adjustment implantation may be performed at this point into the silicon carbide fin 12. The dose of the threshold voltage adjustment implantation is less than the dose of the source and drain implantation to be subsequently performed. The dopants may be selected from the group comprising B, Al, Ga, In, P, Ar, Sb, and a combination thereof. The dopants for the threshold voltage adjustment implantation may be the same conductivity type dopants as, or may be the opposite conductivity type dopants of, the dopants for source and drain region ion implantation to be subsequently performed. Dopant concentration within the silicon carbide fin 12 after the threshold voltage adjustment implantation may be in the range from about $1.0 \times 10^{16}/cm^3$ to about $1.0 \times 10^{20}/cm^3$, and preferably in the range from about $1.0 \times 10^{17}/cm^3$ to about $1.0 \times 10^{19}/cm^3$. Alternatively, the threshold voltage adjustment implantation may be performed in a subsequent processing step.

Referring to FIGS. 4A-4C, an ion implantation blocking structure 40 is formed over a middle portion of the silicon carbide fin 12 in which the channel of a field effect transistor is to be formed subsequently. The ion implantation blocking structure 40 may be formed by deposition of an insulator layer, a semiconductor layer, a conductor layer, or a combination thereof, followed by a lithographic patterning of the deposited layer. The ion implantation blocking structure 40 is a temporary structure that is subsequently removed. The deposited layer has a sufficient thickness $t_b$ over the silicon carbide fin 12 and a lateral dimension $l_b$, to stop the dopant ions during a source and drain implantation to be subsequently performed.

An etch process is employed to transfer the pattern into the deposited layer to form the ion implantation blocking structure 40. The etch process is selective to either the insulator material comprising the first insulator layer 30 and the second insulator layer 32 (which have the same composition) or silicon carbide. In an example, the etch process is selective to the first insulator layer 30 and the second insulator layer 32, and the structure shown in FIGS. 4A-4C results. In another example, the etch process is selective to silicon carbide substrate but not selective to the first insulator layer 30 and the second insulator layer 32, and the exposed portions of the first insulator layer 30 and the second insulator layer 32 outside the ion implantation blocking structure 40 is etched. One skilled in the art may derive the structure for this case from FIGS. 4A-4C.

The first insulator layer 30 and the second insulator layer 32 may comprise a silicon oxide and the ion implantation blocking structure 40 may comprise silicon nitride or polysilicon. Alternatively, the first insulator layer 30 and the second insulator layer 32 may comprise a silicon nitride and the ion implantation blocking structure 40 may comprise silicon oxide or polysilicon.

Referring to FIGS. 5A-5C, a source and drain ion implantation is performed to implant electrical dopants into the exposed portions of the silicon carbide fin 12, i.e., the portions that are not covered by the ion implantation blocking structure 40, to form source and drain regions 42. The electrical dopants may be selected from the group comprising B, Al, Ga, In, P, Ar, Sb, and a combination thereof. Preferably, the angle, dose, and the energy of the ion implantation may be selected to provide a high conductivity to the source and drain regions 42 to minimize the source and drain resistance of the field effect transistor to be formed. Dopant concentration within the source and drain regions 42 may be in the range from about $1.0 \times 10^{20}/cm^3$ to about $1.0 \times 10^{22}/cm^3$, and preferably in the range from about $3.0 \times 10^{20}/cm^3$ to about $1.0 \times 10^{21}/cm^3$ Referring to FIGS. 6A-6C, a gate level dielectric 50 is deposited on the first insulator layer 30, the second insulator layer 32, the ion implantation blocking structure 40, and the exposed portions of the pair of graphene layers 22 on the first pair of sidewalls 16. The gate dielectric 50 comprises a dielectric material having a composition that is different from the ion implantation blocking structure 40. This is because the ion implantation blocking structure 40 needs to be subsequently removed selective to the gate level dielectric 50. The gate level dielectric 50 is planarized employing a top surface of the ion implantation blocking structure 40 as an etch stop. In an example, the ion implantation blocking structure 40 may comprise polysilicon, and the gate level dielectric 50 may comprise silicon nitride or silicon oxide. In another example, the ion implantation blocking structure 40 may comprise silicon oxide and the gate level dielectric 50 may comprise silicon nitride. In yet another example, the ion implantation blocking structure 40 may comprise silicon nitride and the gate level dielectric 50 may comprise silicon oxide.

Figure 7C:
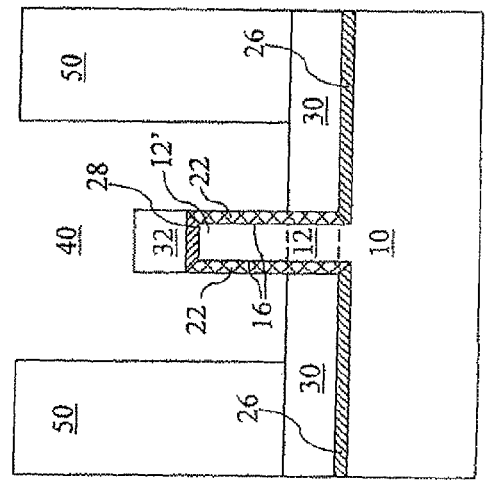
Figure 7A:
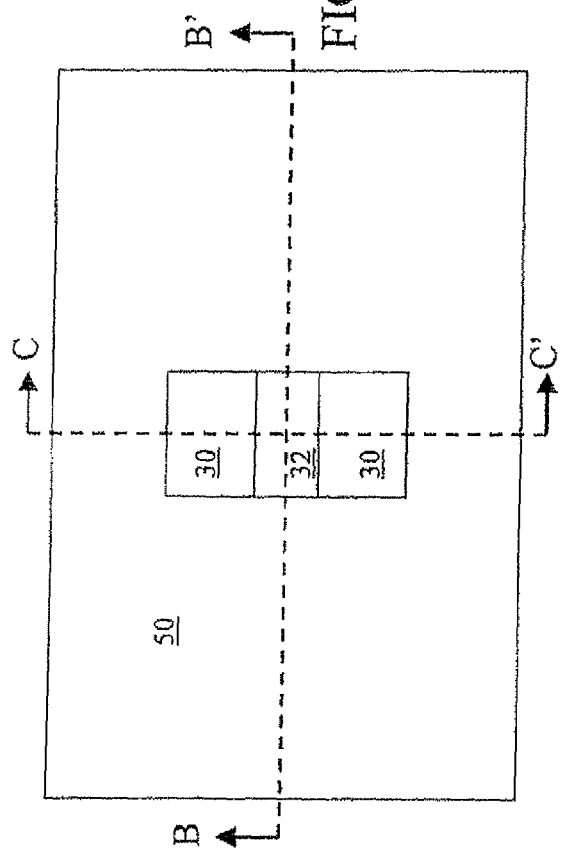
Figure 7B:
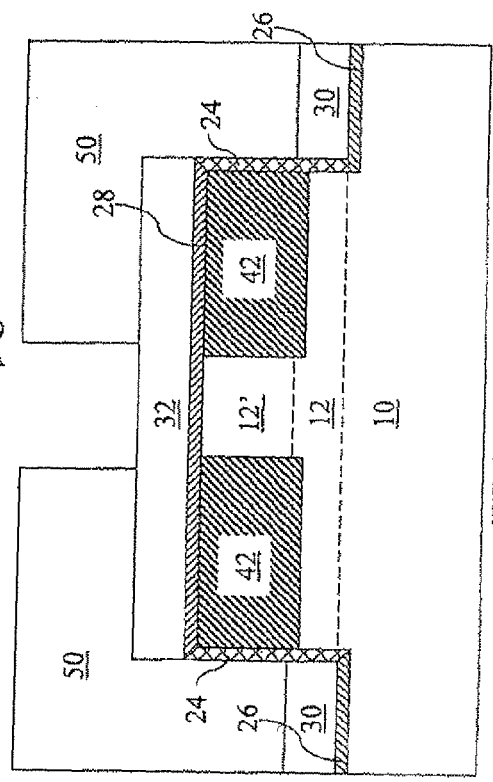

Referring to FIGS. 7A-7C, the ion implantation blocking structure 40 is removed by an etching process, i.e., a wet etch or a reactive ion etch. The channel portion of the pair of graphene layers 22 on the first pair of sidewalls 16 is exposed at this point. If a threshold voltage adjustment implantation is not performed in one of the prior processing steps, the threshold voltage adjustment implantation into the silicon carbide fin 12 may be performed at this point. If the threshold voltage adjustment implantation is performed into the silicon carbide fin 12 at any processing step up to this point, a threshold voltage adjustment implant region 12' is formed within the silicon carbide fin 12 between the source and drain regions 42. The silicon carbide fin 12 contains the source and drain regions 42 and the threshold voltage adjustment implant region 12'.

Figure 8C:
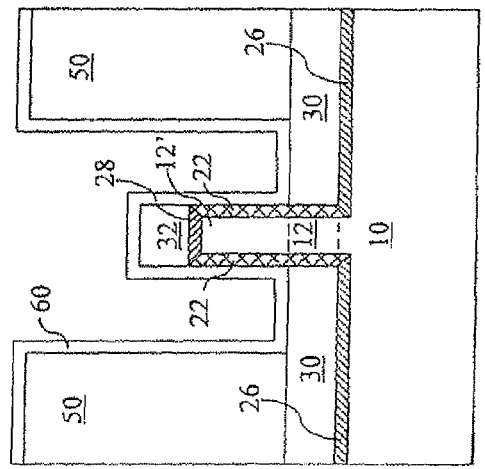
Figure 8A:
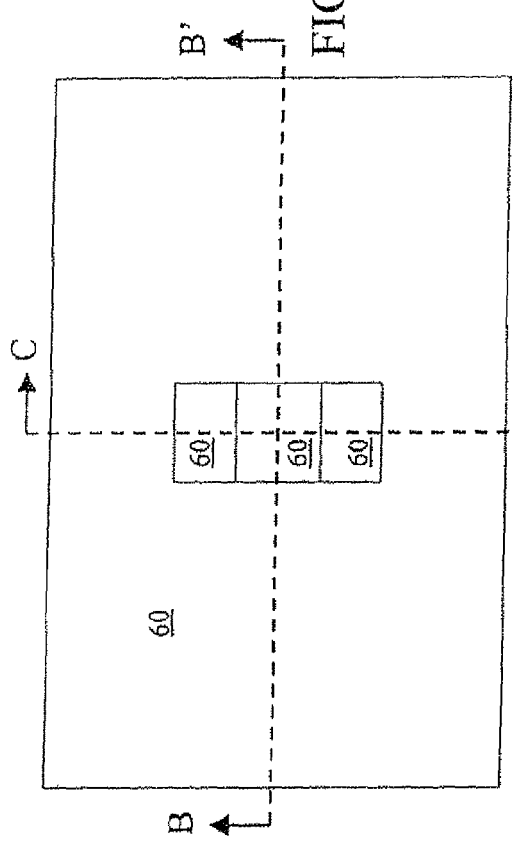
Figure 8B:
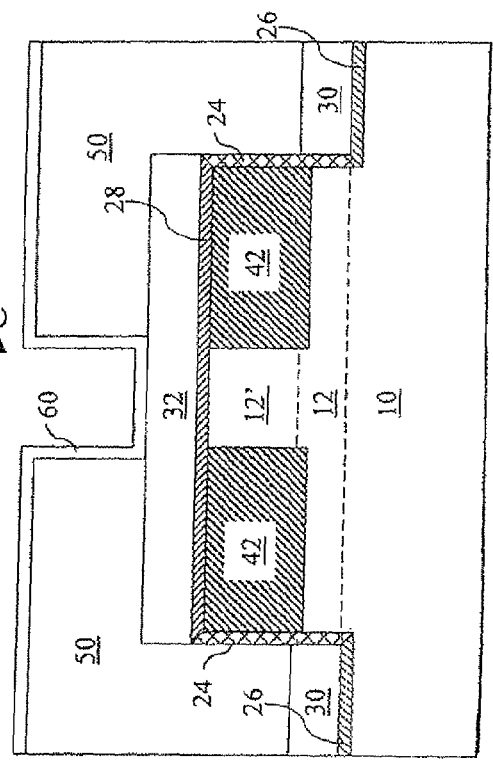

Referring to FIGS. 8A-8C, a gate dielectric 60 is formed on the pair of graphene layers 22 on the first pair of sidewalls 16 and on other exposed surfaces. The gate dielectric 60 may comprise a high-k dielectric material such as $HfO_2$, $ZrO_2$, $Al_2O_3$, $TiO_2$, $La_2O_3$, $SrTiO_3$, $LaAlO_3$, hafnium silicates, barium-strontium-titanates (BSTs) or lead-zirconate-titanates (PZTs). The gate dielectric materials may be formed by atomic layer deposition (ALD), thermal or plasma oxidation, thermal or plasma nitridation, chemical vapor deposition (CVD), and/or physical vapor deposition (PVD). The total thickness of the second gate dielectric layer 40 is in the range from about 1 nm to about 10 nm, and preferably in the range from about 1 nm to about 5 nm. Alternately, the gate dielectric 60 may comprise a conventional gate dielectric, such as silicon oxide or silicon nitride, that is deposited by chemical vapor deposition to similar thicknesses.

Referring to FIGS. 9A-9C, a gate electrode 70 is formed directly on top of the gate dielectric 60. The gate electrode 70 is formed by depositing a gate electrode material and planarizing the gate electrode material employing a stopping layer. The stopping layer may be the gate level dielectric 50 or the gate dielectric 60. The gate electrode 70 may comprise base metals, metal alloys or conductive refractory metal nitrides such as TaN, TiN, and WN. Alternately, the gate electrode 70 may comprise a semiconductor material such as polysilicon, silicon carbide, silicon-germanium alloy, or a combination thereof.

Figure 10C:
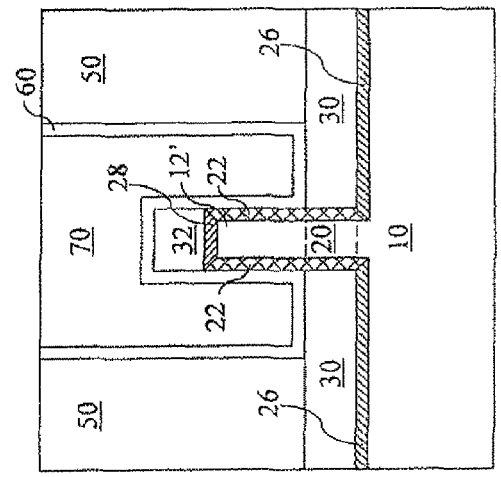
Figure 10A:
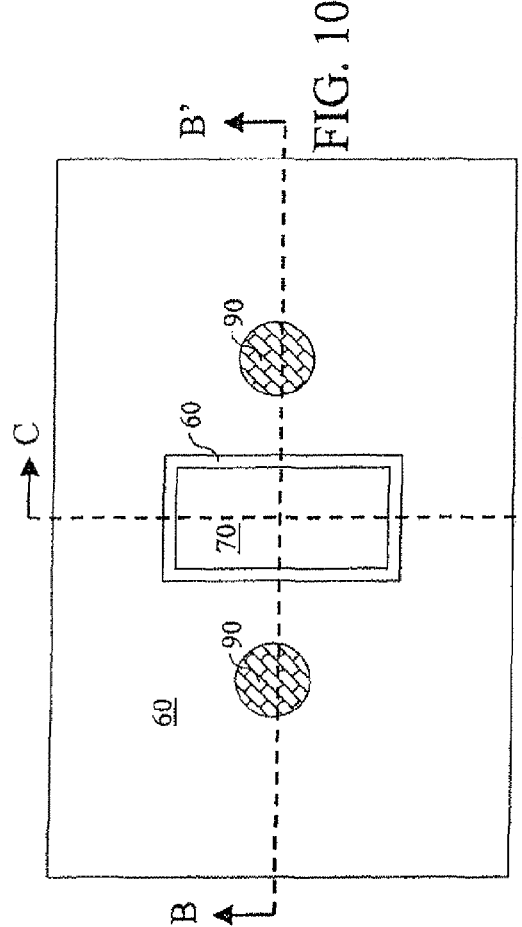
Figure 10B:
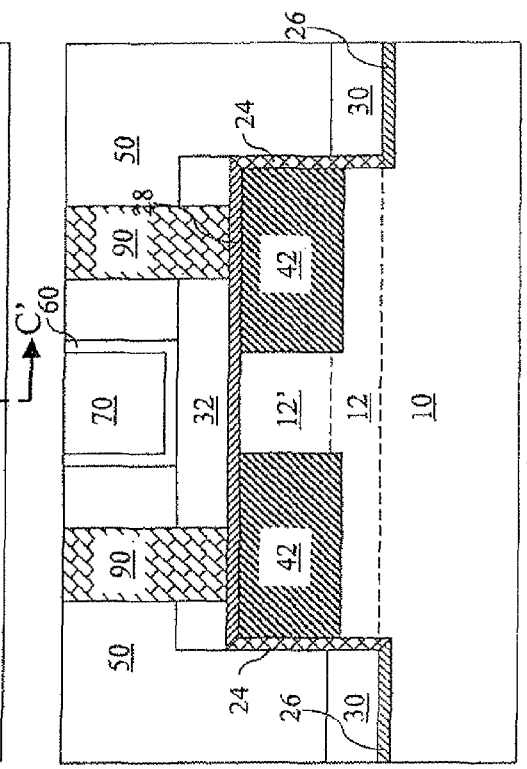

Referring to FIGS. 10A-10C, contact via holes may be formed within the gate level dielectric 50 and filled with metal to form contact vias 90. Preferably, the contact vias 90 contact the source and drain regions 42 within the silicon carbide fin 12. If the width w of the silicon carbide fin 12 is less than the diameter of the contact vias 90, the contact vias 90 contacts the pair of graphene layers 22 on the first pair of sidewalls 16 as well. If the width w of the silicon carbide fin is substantially greater than the diameter of the contact vias 90, the contact vias 90 may not contact the pair of graphene layers 22 on the first pair of sidewalls 16.

Referring to FIGS. 11A-11C, an alternate first field effect transistor structure according to the first embodiment of the present invention is shown. After the formation of the structure shown in FIGS. 9A-9C, a middle-of-line (MOL) dielectric 80 is deposited on the gate level dielectric 50 and the gate electrode 70. The MOL dielectric 80 may comprise silicon oxide or silicon nitride. Contact via holes may be formed within the MOL dielectric 80 and/or the gate level dielectric 50 and filled with metal to form contact vias 90. Preferably, the contact vias 90 contacts the source and drain regions 42 within the silicon carbide fin 12. Further, the gate electrode 70 may be contacted by one of the contact vias 90.

Figure 12:
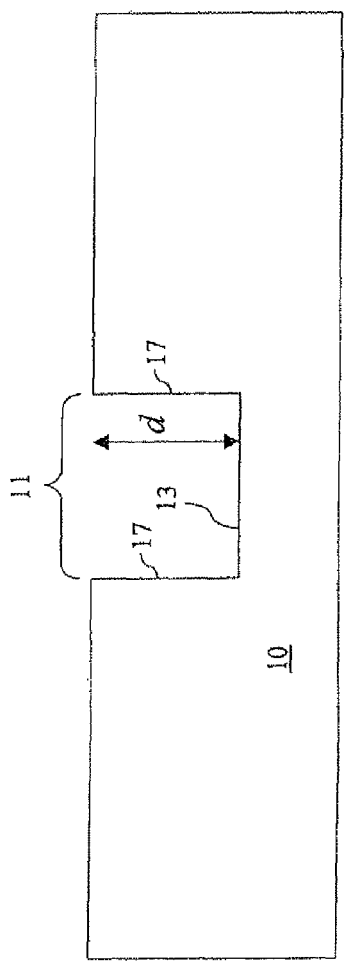

According to a second embodiment of the present invention, a trench 11 having a substantially flat bottom surface 13 and a pair of trench sidewalls 17 is formed in a silicon carbide substrate 10 as shown in FIG. 12. The trench 11 is formed within the silicon carbide substrate 10 by lithographic patterning and etching. For example, a photoresist (not shown) may be applied over a planar top surface of the silicon carbide substrate 10 followed by a lithographic patterning of the photoresist. The pattern in the photoresist is transferred into the silicon carbide substrate 10 to form the trench 11. The portion of the silicon carbide substrate 10 that is not covered by the photoresist corresponds to the trench 11.

Preferably, the depth d of the trench 11 exceeds the depth of source and drain regions to be subsequently formed. The crystallographic orientations of the silicon carbide substrate 10 are chosen such that the substantially flat bottom surface 13 is conducive to formation of a graphene layer. For example, the orientation of the substantially flat bottom surface 13 may have the (0001) orientation of an alpha silicon carbide ($\alpha$-SiC) crystal, which has a hexagonal crystal structure. Other crystallographic surfaces of silicon carbide that are conducive to the formation of a graphene layer, such as (111) plane of a beta silicon carbide ($\beta$-SiC) crystal, which has a face centered cubic structure, may also be employed. Preferably, the pair of trench sidewalls 17 is also conducive to formation of the graphene layer 20. The depth d of the trench may be in the range from about 5 nm to about 200 nm, and preferably in the range from about 30 nm to about 100.

Figure 13:
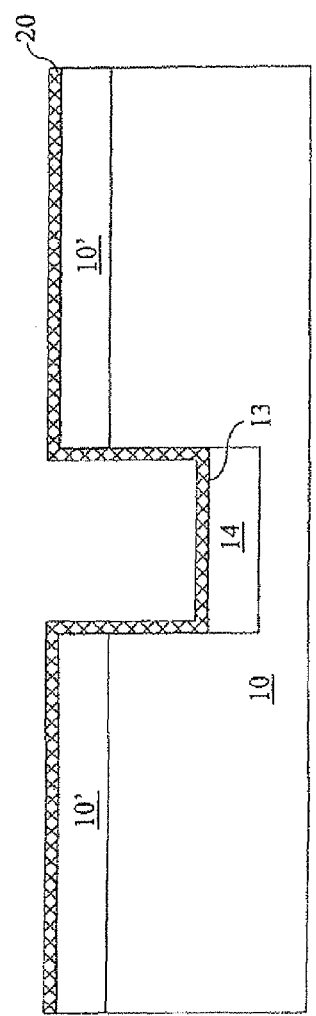

Referring to FIG. 13, a graphene layer 20 is grown by solid state graphitization. Carbon atoms are sublimated during the graphitization process from the exposed silicon carbide surfaces. In particular, the graphene layer 20 is grown from the substantially flat bottom surface 13 of the trench 11. The graphene layer 20 has a thickness in the range from about 1 monolayer to about 10 monolayers of carbon. Preferably, the graphene layer 20 is also grown from the pair of trench sidewalls 17 as well. In the case in which the pair of trench sidewalls 17 is not conducive to formation of the graphene layer 20, the present invention may be practiced with a carbon layer having a different structural arrangement, such as soot or fullerenes, that substitutes the sidewall portion of the graphene layer 20.

Optionally, a threshold voltage adjustment implantation may be performed at this point into the silicon carbide substrate 10 to form a threshold voltage adjustment implant region 14 beneath the substantially flat bottom surface 13 and lightly doped regions 10' outside the trench 11. The dopants may be selected from the group comprising B, Al, Ga, In, P, Ar, Sb, and a combination thereof. The dopants for the threshold voltage adjustment implantation may be the same conductivity type dopants as, or may be the opposite conductivity type dopants of, the dopants for source and drain region ion implantation to be subsequently performed. Dopant concentration within the threshold voltage adjustment implant region 14 after the threshold voltage adjustment implantation may be in the range from about $1.0\times10^{16}$/cm$^3$ to about $1.0\times10^{20}$/cm$^3$, and preferably in the range from about $1.0\times10^{17}$/cm$^3$ to about $1.0\times10^{19}$/cm$^3$. Alternatively, the threshold voltage adjustment implantation may be performed in a subsequent processing step.

Figure 14:
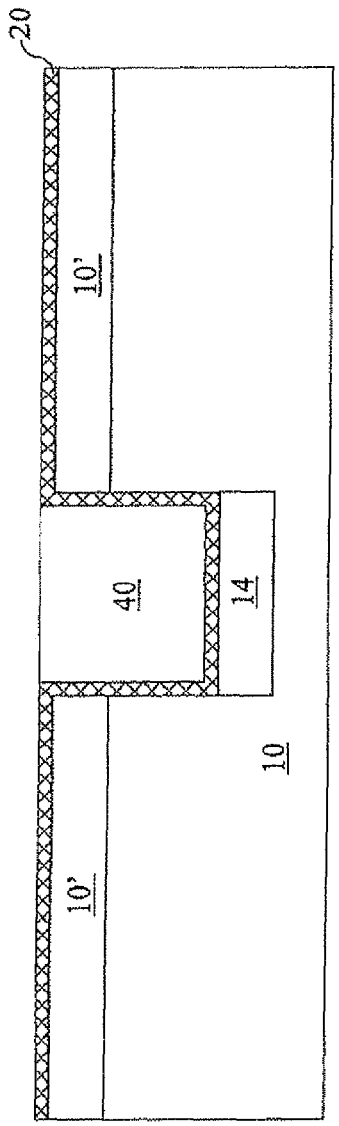

Referring to FIG. 14, an ion implantation blocking structure 40 is formed within the trench 11. The ion implantation blocking structure 40 may be formed by deposition of a photoresist, an insulator layer, a semiconductor layer, a conductor layer, or a combination thereof, followed by a planarization process. In the case of the photoresist, the planarization process may be performed by a resist recess etch with an endpoint detection triggered by exposure of the graphene layer 20 located on a top surface of the silicon carbide substrate 10. In the case of the insulator layer, the semiconductor layer, or the conductor layer, the planarization process may be performed by chemical mechanical planarization employing either the graphene layer 20 or the top surface of the silicon carbide layer as a stopping layer. For example, the ion implantation blocking structure 40 may comprise silicon oxide, silicon nitride, or polysilicon. The ion implantation blocking structure 40 is a temporary structure that is subsequently removed.

Figure 15:
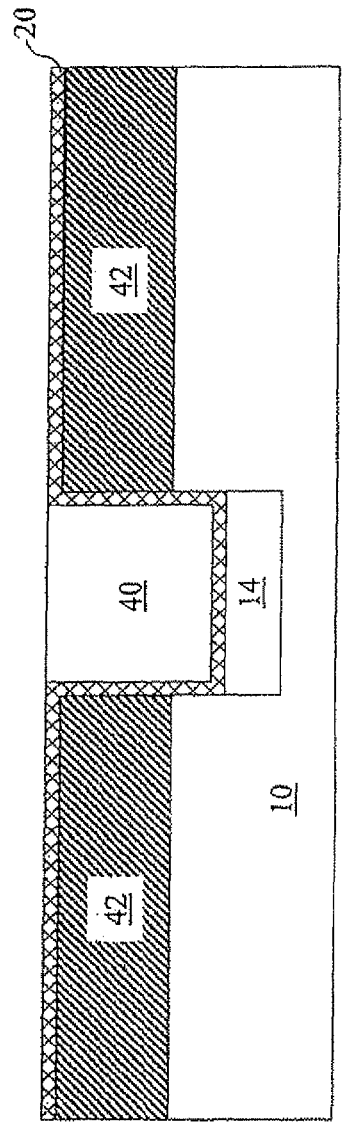

Referring to FIG. 15, a source and drain ion implantation is performed to implant electrical dopants into the silicon carbide substrate 10 to form source and drain regions 42. The electrical dopants may be selected from the group comprising B, Al, Ga, In, P, Ar, Sb, and a combination thereof. Preferably, the angle, dose, and the energy of the ion implantation may be selected to provide a high conductivity to the source and drain regions 42 to minimize the source and drain resistance of the field effect transistor to be formed. Dopant concentration within the source and drain regions 42 may be in the range from about $1.0\times10^{20}$/cm$^3$ to about $1.0\times10^{22}$/cm$^3$, and preferably in the range from about $3.0\times10^{20}$/cm$^3$ to about $1.0\times10^{21}$/cm$^3$. The depth of the ion implantation does not exceed the depth d of the trench 11. Due to the presence of the ion implantation blocking structure 40 over the substantially flat bottom surface 13 of the trench 11, the dopants do not reach the threshold voltage adjustment implant region 14. Therefore, the source and drain regions 42 are separated from the threshold voltage adjustment implant region 14.

Figure 16:
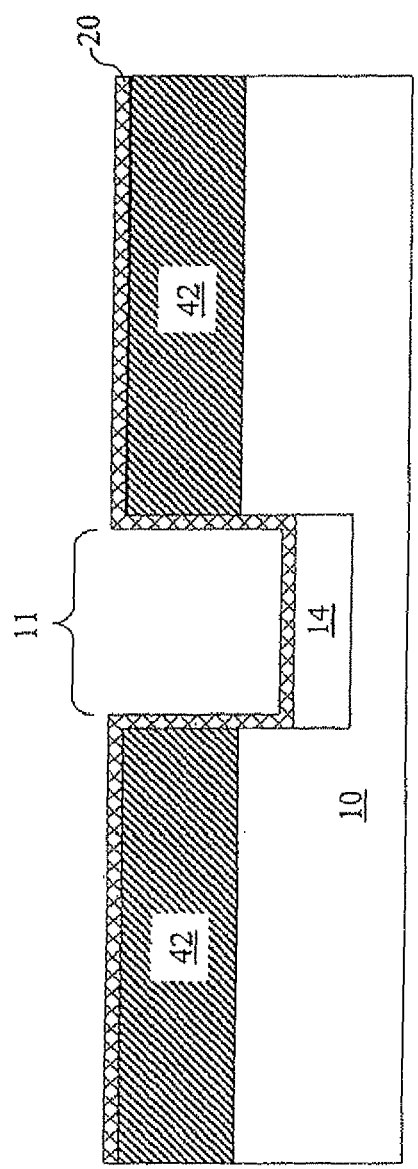

Referring to FIG. 16, the ion implantation blocking structure 40 is removed from the trench 11 by an etching process, i.e., a wet etch or a reactive ion etch. The channel portion of the pair of graphene layer 20 on the substantially flat bottom surface 13 is exposed at this point. If a threshold voltage adjustment implantation is not performed in one of the prior processing steps, the threshold voltage adjustment implantation into the substantially flat bottom surface 13 may be performed at this point. If the threshold voltage adjustment implantation is performed into the substantially flat bottom surface 13 of the trench 11 at any processing step up to this point, a threshold voltage adjustment implant region 14 is formed within the silicon carbide substrate 10 between the source and drain regions 42. The silicon carbide substrate 10 contains the source and drain regions 42 and the threshold voltage adjustment implant region 14. The threshold voltage adjustment implant region 14 does not adjoin the source and drain regions 42.

Figure 17:
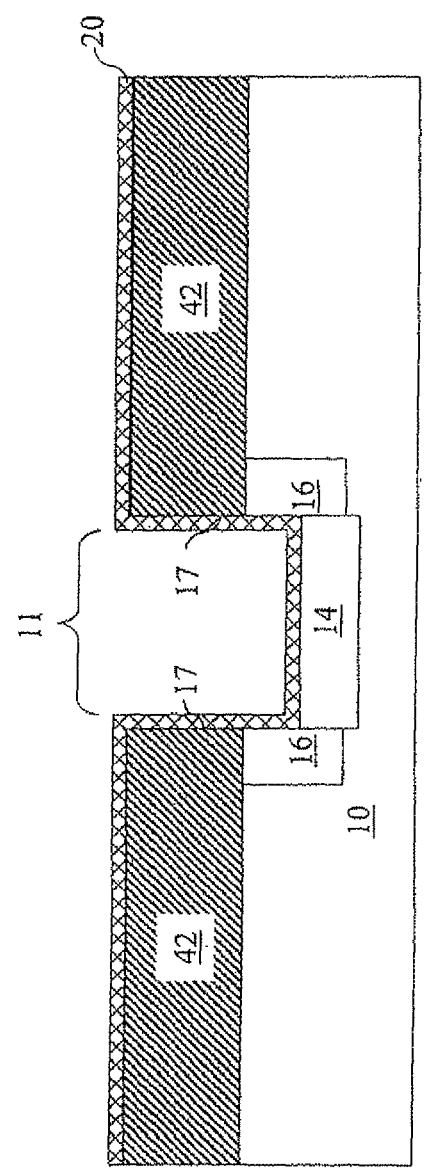

Referring to FIG. 17, a halo implantation may be performed into at least one of the pair of trench sidewalls 17 to form at least one halo implant region 16. The dopants of the halo implantation may be the same, or opposite, conductivity type dopants as the dopants of the threshold voltage adjustment implant region 14. The dopant type, dose, and energy of the halo implantation are determined by performance requirements of the field effect transistor to be formed. The at least one halo implant region 16 abuts both the threshold voltage adjustment implant region 14 and one of the source and drain regions 42.

Figure 18:
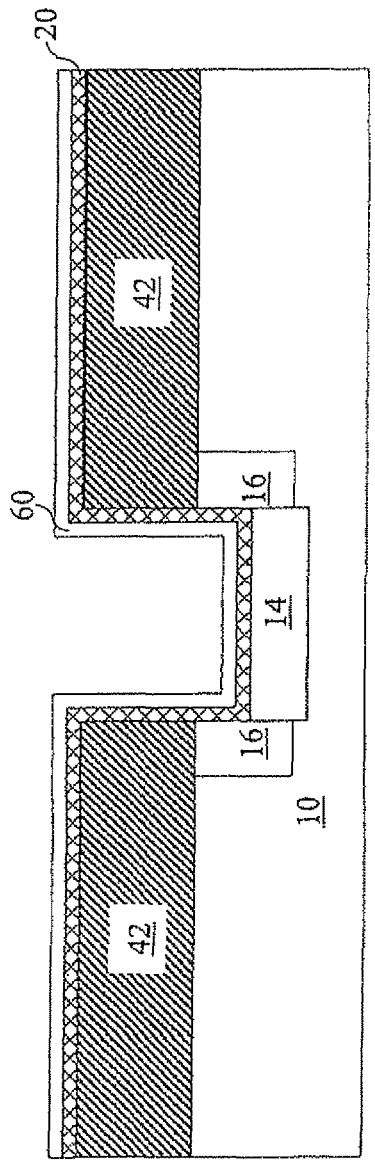

Referring to FIG. 18, a gate dielectric 60 is formed on the graphene layer 20, including the portion on the substantially flat bottom surface 13 of the trench 11. The gate dielectric 60 may comprise the same high-k dielectric material or a conventional gate dielectric described above in the first embodiment of the present invention, and may have the same thickness.

Figure 19:
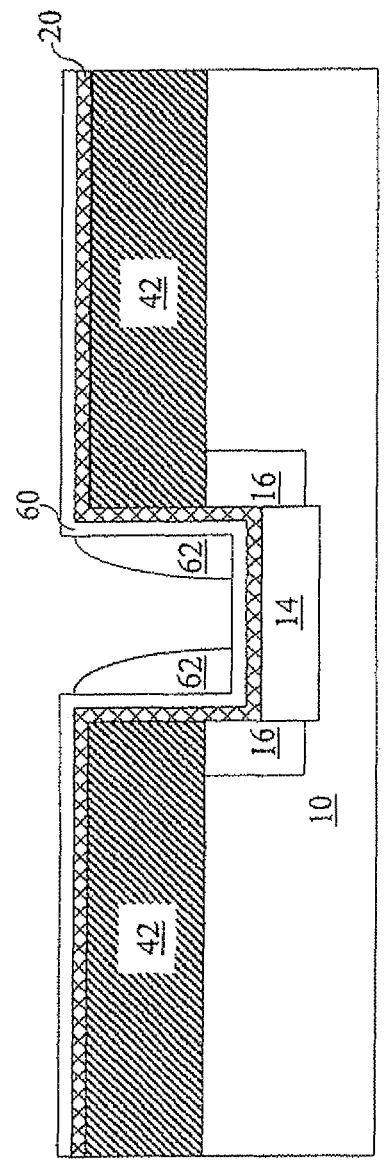

Referring to FIG. 19, a gate spacer 62 may be optionally formed inside the trench 11 to reduce the overlap of a gate electrode to be formed within the trench 11 and a channel which includes the portion of the graphene layer 20 on the substantially flat bottom surface 13 of the trench 11. The gate spacer is formed by methods well known in the art, i.e., by deposition of a conformal dielectric layer and an anisotropic etching such as a reactive ion etch.

Figure 20:
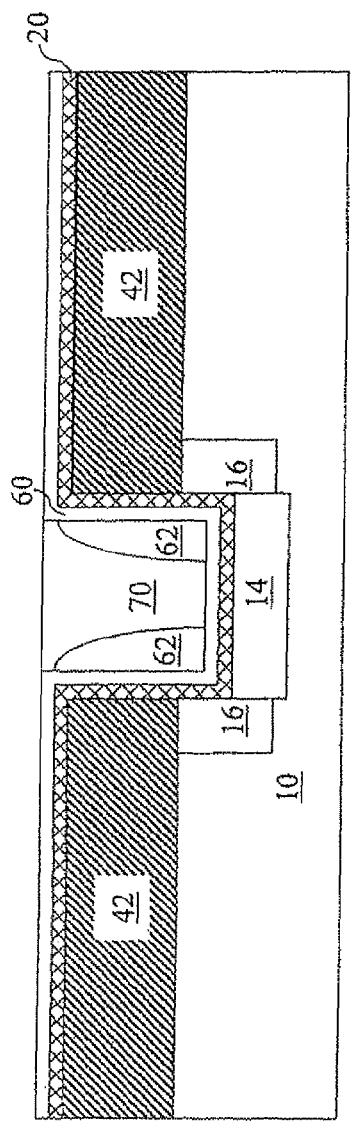

Referring to FIG. 20, a gate electrode 70 is formed on the gate dielectric 60 within the remaining volume of the trench 11. The gate electrode 70 is formed by depositing a gate electrode material and planarizing the gate electrode material by chemical mechanical planarization (CMP) employing a stopping layer. The stopping layer may be the gate dielectric 60, the top surface of the silicon carbide substrate 10, or the graphene layer 20. The structure in FIG. 20 shows a structure in which the gate dielectric 60 is employed as the stopping layer of the CMP process. The gate electrode 70 may comprise the same material as the gate electrode 70 in the first embodiment of the present invention.

Figure 21:
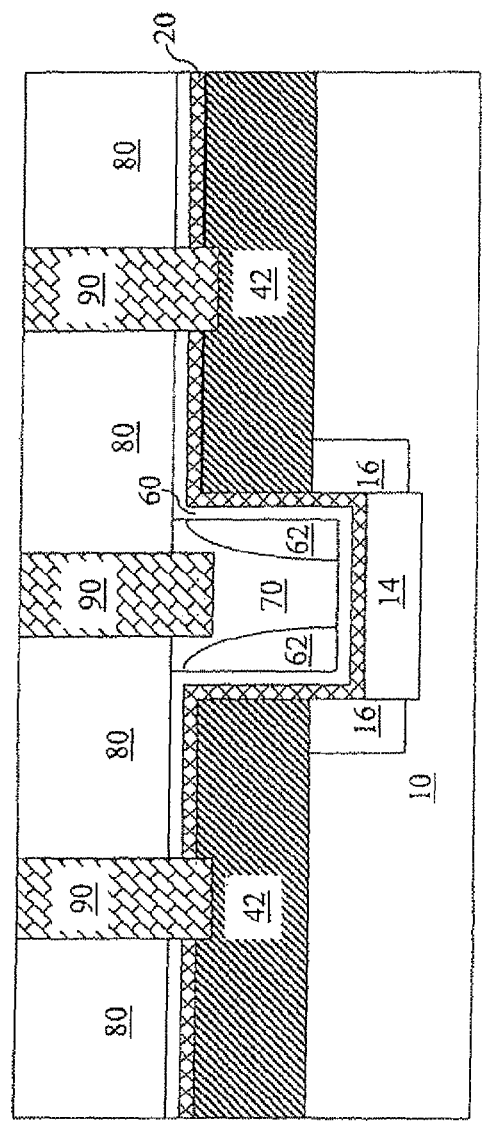

Referring to FIG. 21, a middle-of-line (MOL) dielectric 80 is deposited on the gate dielectric 60 and the gate electrode 70. The MOL dielectric 80 may comprise silicon oxide or silicon nitride. Contact via holes may be fowled within the MOL dielectric 80 and filled with metal to form contact vias 90. Preferably, the contact vias 90 contacts the source and drain regions 42 within the silicon carbide fin 12. Further, the gate electrode 70 may be contacted by one of the contact vias 90.

Referring to FIG. 22, a first alternate structure according to the second embodiment of the present invention is obtained by alteration of the processing steps. Specifically, the top surface of the silicon carbide substrate 10 is employed as the stopping layer during the CMP process. In this case, the MOL dielectric directly contacts the source and drain regions 42 located within the silicon carbide substrate 10. The threshold voltage adjustment implant region 14 may be formed after the removal of the ion implantation blocking structure 40 within the trench 11 so that the outer boundary of the ion implantation blocking structure 40 is substantially coincident with the inner surface of the sidewall portions of the graphene layer 20 within the trench 11.

Referring to FIG. 23, a second alternate structure according to the second embodiment of the present invention is obtained by removing the portion of the gate dielectric 60 over the top surface of the silicon carbide substrate 10, for example during the CMP step or after the CMP step. In this case, the at least one halo implant region is not formed. Further, formation of a gate spacer 62 is omitted in the processing steps, providing a structure in which the gate electrode 70 directly contacts sidewall portions of the graphene layer 20.

Figure 24:
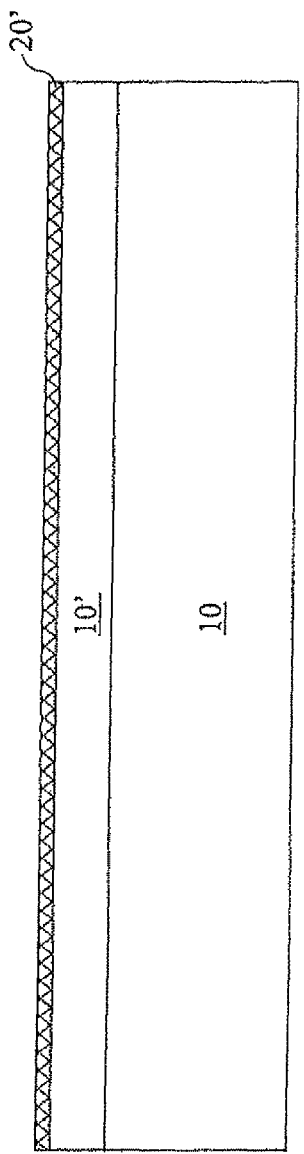

According to a third embodiment of the present invention, a field effect transistor is formed on a planar silicon carbide substrate 10 as shown in FIG. 24. A planar graphene layer 20' is grown by solid state graphitization. The method of formation of the planar graphene layer 20' is the same as in the first and second embodiments described above. Preferably, the orientation of the silicon carbide substrate is selected such that the top surface of the silicon carbide substrate 10 is conducive to the formation of the planar graphene layer 20', for example, has a (0001) orientation of an alpha silicon carbide (α-SiC) crystal, which has a hexagonal crystal structure. Other crystallographic surfaces of silicon carbide that are conducive to the formation of a graphene layer, such as (111) plane of a beta silicon carbide (β-SiC) crystal, which has a face centered cubic structure, may also be employed to form the planar graphene layer 20'.

Optionally, a threshold voltage adjustment implantation may be performed at this point into the silicon carbide substrate 10 to form a lightly doped region 10' beneath the top surface of the silicon carbide substrate 10. The dopants may be selected from the group comprising B, Al, Ga, In, P, Ar, Sb, and a combination thereof. The dopants for the threshold voltage adjustment implantation may be the same conductivity type dopants as, or may be the opposite conductivity type dopants of, the dopants for source and drain region ion implantation to be subsequently performed. Dopant concentration within the lightly doped region 10 after the threshold voltage adjustment implantation may be in the range from about $1.0 \times 10^{16}/cm^3$ to about $1.0 \times 10^{20}/cm^3$, and preferably in the range from about $1.0 \times 10^{17}/cm^3$ to about $1.0 \times 10^{19}/cm^3$. Alternatively, the threshold voltage adjustment implantation may be performed in a subsequent processing step.

Figure 25:
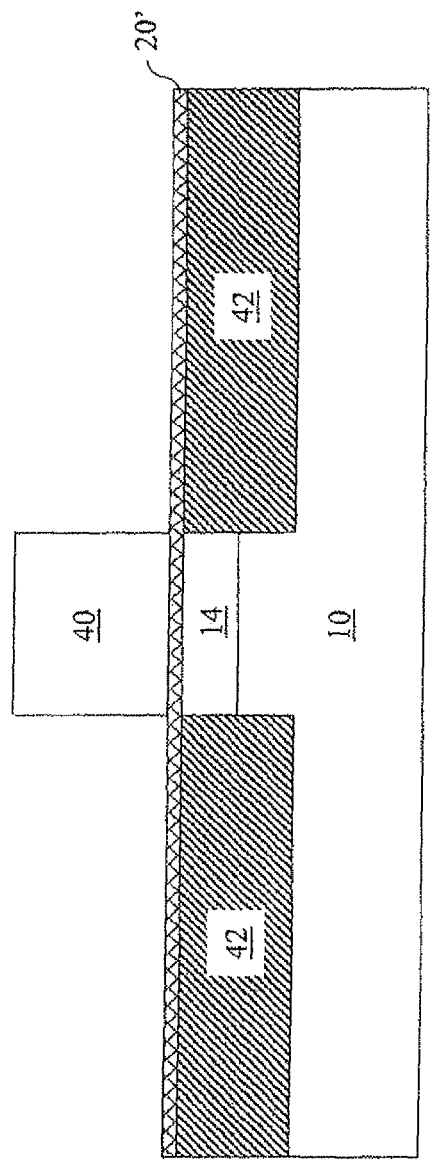

Referring to FIG. 25, an ion implantation blocking structure 40 is formed on the portion of the planar graphene layer 20' in which a channel of a field effect transistor is to be subsequently formed by deposition of an ion implantation blocking layer (not shown) and lithographic patterning. The ion implantation blocking structure 40 may be formed by a deposition an insulator layer, a semiconductor layer, a conductor layer, or a combination thereof. For example, the ion implantation blocking structure 40 may comprise silicon oxide, silicon nitride, or polysilicon. The ion implantation blocking structure 40 is a temporary structure that is subsequently removed.

A source and drain ion implantation is performed to implant electrical dopants into the silicon carbide substrate 10 to form source and drain regions 42. The ion implantation blocking structure 40 blocks the electrical dopants from the portion of the silicon carbide substrate 10 beneath the ion implantation blocking structure 40. The dopant concentration due to the source and drain ion implantation exceeds the dopant concentration of the lightly doped region 10'. As a consequence, the portions of the lightly doped region 10' that are not covered by the ion implantation blocking structure 40 are incorporated into the source and drain regions 42. If the threshold voltage adjustment has been performed, the remaining portion of the lightly doped region 10' between the source and drain regions 42 becomes a threshold voltage implant region 14.

The electrical dopants may be selected from the group comprising B, Al, Ga, In, P, Ar, Sb, and a combination thereof. Preferably, the angle, dose, and the energy of the ion implantation may be selected to provide a high conductivity to the source and drain regions 42 to minimize the source and drain resistance of the field effect transistor to be formed. Dopant concentration within the source and drain regions 42 may be in the range from about $1.0 \times 10^{20}/cm^3$ to about $1.0 \times 10^{22}/cm^3$, and preferably in the range from about $3.0 \times 10^{20}/cm^3$ to about $1.0 \times 10^{21}/cm^3$.

Referring to FIG. 26, a gate level dielectric 50 is deposited on the ion implantation blocking structure 40 and on the planar graphene layer 20'. The gate dielectric 50 comprises a dielectric material having a composition that is different from the ion implantation blocking structure 40. This is because the ion implantation blocking structure 40 needs to be subsequently removed selective to the gate level dielectric 50. The gate level dielectric 50 is planarized employing a top surface of the ion implantation blocking structure 40 as an etch stop. If the ion implantation blocking structure 40 comprises polysilicon, the gate level dielectric 50 may comprise silicon nitride or silicon oxide. If the ion implantation blocking structure 40 comprises silicon oxide, the gate level dielectric 50 may comprise silicon nitride. If the ion implantation blocking structure 40 comprises silicon nitride, the gate level dielectric 50 may comprise silicon oxide.

Referring to FIG. 27, the ion implantation blocking structure 40 is removed from the trench 11 by an etching process, i.e., a wet etch or a reactive ion etch. The channel portion of the planar graphene layer 20' and substantially vertical sidewalls of the gate level dielectric 50 are exposed at this point. If a threshold voltage adjustment implantation is not performed in one of the prior processing steps, the threshold voltage adjustment implantation into the portion of the silicon carbide substrate 10 underneath the opening O. If the threshold voltage adjustment implantation is performed into the silicon carbide substrate 10 at any processing step up to this point, a threshold voltage adjustment implant region 14 is formed within the silicon carbide substrate 10 between the source and drain regions 42. The silicon carbide substrate 10 contains the source and drain regions 42 and the threshold voltage adjustment implant region 14. The threshold voltage adjustment region abuts the source and drain regions 42.

Figure 28:
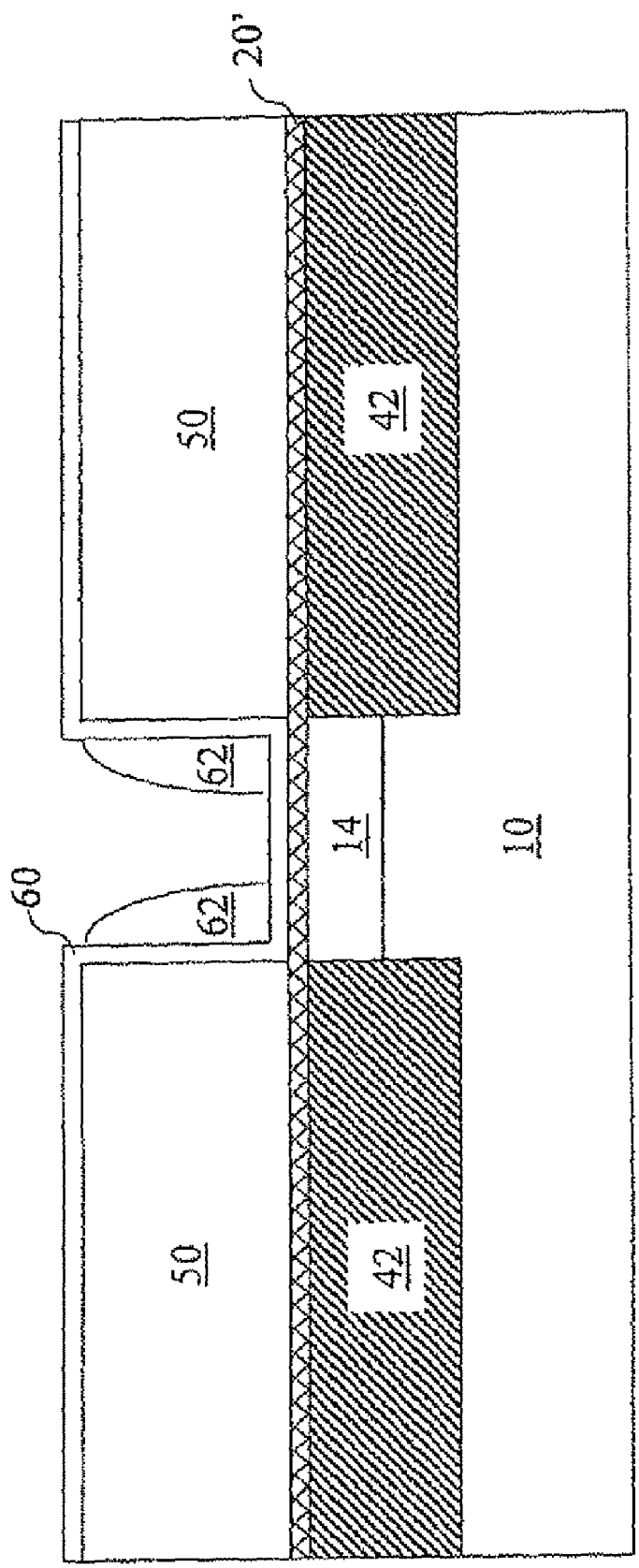

Referring to FIG. 28, a gate dielectric 60 is formed on the planar graphene layer 20', the substantially vertical sidewalls of the gate level dielectric 50, and the top surface of the gate level dielectric 50. The gate dielectric 60 may comprise the same high-k dielectric material or a conventional gate dielectric described above in the first embodiment of the present invention, and may have a similar thickness.

A gate spacer 62 may be optionally formed on substantially vertical sidewalls of the gate dielectric 60 and along the edge of the bottom portion of the gate dielectric 50 which contacts the planar graphene layer 20'. The gate spacer 62 is formed by methods well known in the art, i.e., by deposition of a conformal dielectric layer and an anisotropic etching such as a reactive ion etch.

Figure 29:
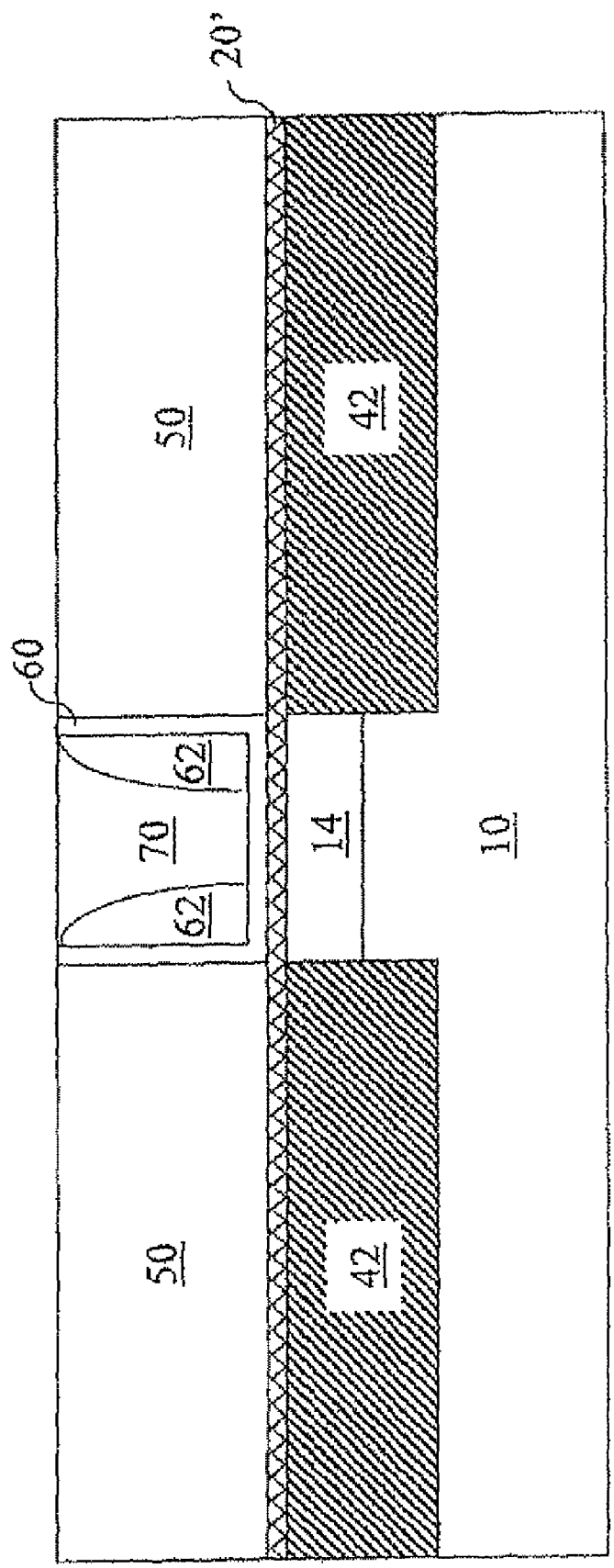

Referring to FIG. 29, a gate electrode 70 is thereafter formed on the gate dielectric 60 within the volume bounded by either the gate spacers 62, if employed, or by the substantially vertical sidewalls of the gate level dielectric 50 over. The gate electrode 70 is formed by depositing a gate electrode material and planarizing the gate electrode material by chemical mechanical planarization (CMP) employing a stopping layer. The stopping layer may be the gate dielectric 60 or the top surface of the silicon carbide substrate 10. The gate electrode 70 may comprise the same material as the gate electrode 70 in the first embodiment of the present invention.

Figure 30:
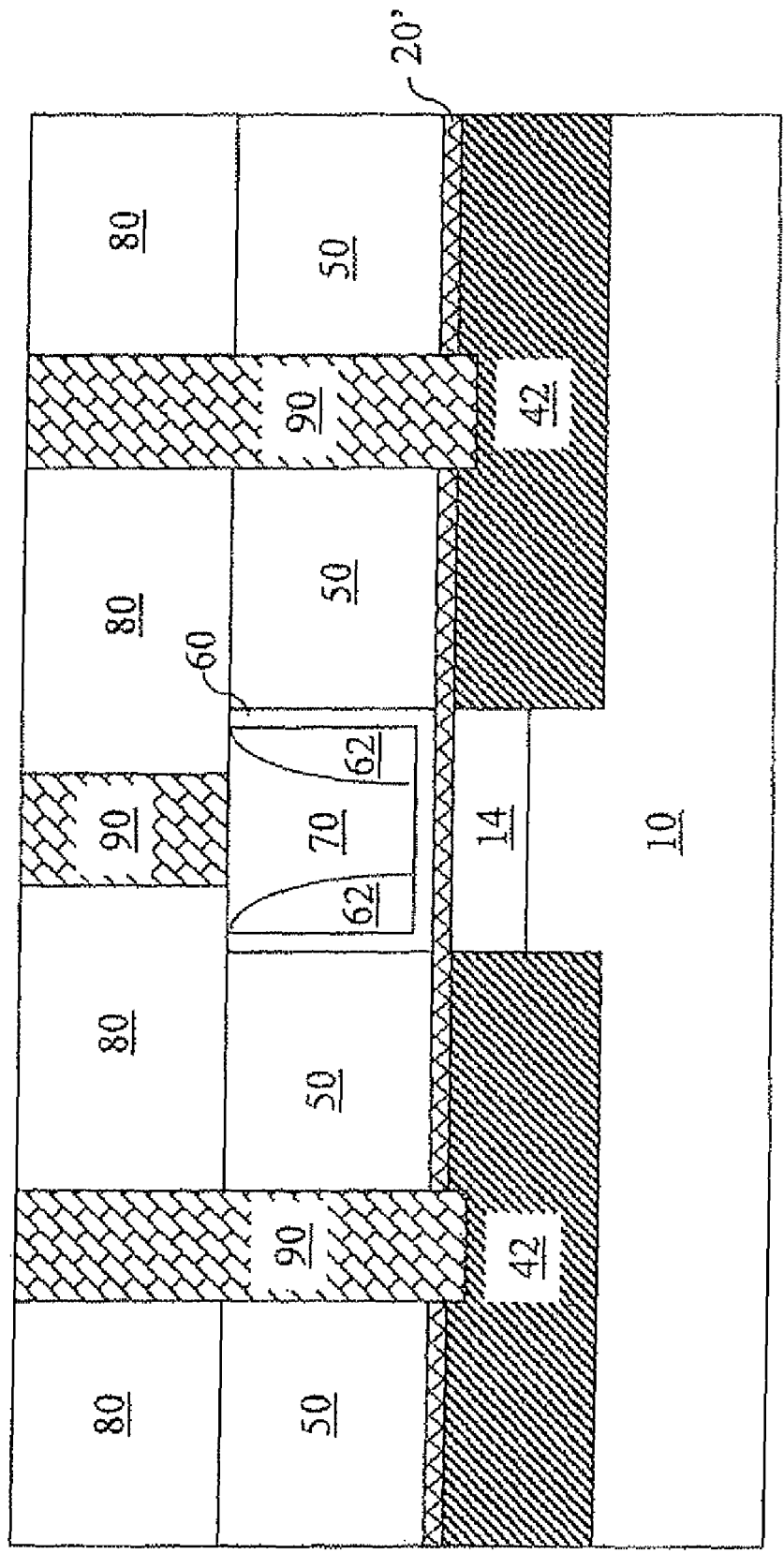

Referring to FIG. 30, a middle-of-line (MOL) dielectric 80 is deposited on the gate level dielectric 50 and the gate electrode 70. The MOL dielectric 80 may comprise silicon oxide or silicon nitride. Contact via holes may be formed within the MOL dielectric 80 and filled with metal to form contact vias 90. Preferably, the contact vias 90 contacts the source and drain regions 42 within the silicon carbide fin 12. Further, the gate electrode 70 may be contacted by one of the contact vias 90.

Referring to FIG. 31, an alternative field effect transistor structure according to the third embodiment of the present invention does not contain the gate spacers 62.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of manufacturing a field effect transistor comprising:
    providing a silicon carbide substrate;
    forming at least one pair of sidewalls conducive to graphitization on said silicon carbide substrate;
    performing a solid state graphitization on exposed surfaces of said silicon carbide substrate including said at least one pair of sidewalls, wherein at least one graphene layer is formed on said silicon carbide substrate, said at least one graphene layer contiguously extending, in order, through a first horizontal graphene layer, a first vertical graphene layer, a second horizontal graphene layer, a second vertical graphene layer, and a third horizontal graphene layer that is coplanar with said first horizontal graphene layer, wherein said second horizontal graphene layer is vertically offset from said first and third graphene layers, and said first and second vertical graphene layers are formed by graphitization of said at least one pair of sidewalls;
    forming an ion implantation blocking structure over a portion of said at least one graphene layer;
    forming doped source and drain regions within said silicon carbide substrate;
    removing said ion implantation blocking structure;
    forming a gate dielectric over said portion of said at least one graphene layer; and
    forming a gate electrode directly on said gate dielectric layer.

2. The method of claim 1, further comprising forming a threshold voltage adjustment implant region beneath said at least one graphene layer.

3. The method of claim 1, further comprising forming a silicon carbide fin directly on said silicon carbide substrate, wherein said at least one graphene layer is a pair of graphene layers on a pair of sidewalls of said silicon carbide fin.

4. The method of claim 1, further comprising forming a trench in said silicon carbide substrate, wherein said second horizontal graphene layer contacts a substantially flat bottom surface of said trench.

5. The method of claim 4, wherein said second horizontal graphene layer contacts a bottom surface of said trench.

6. The method of claim 4, further comprising forming a threshold voltage adjustment implant region directly underneath a bottom surface of said trench prior to forming said doped source and drain regions.

7. The method of claim 6, wherein doped regions having a same dopant concentration as said threshold voltage adjustment implant region are formed directly underneath a topmost surface of said silicon carbide substrate.

8. The method of claim 4, wherein said threshold voltage adjustment implant region contacts an entirety of said channel portion and has a same type of doping said doped source and drain regions.

9. The method of claim 1, further comprising forming a gate spacer, wherein said gate dielectric contains at least one substantially vertical portion that abuts said gate spacer.

10. The method of claim 1, further comprising forming a gate level dielectric over said silicon carbide substrate in an area outside said ion implantation blocking structure.

11. The method of claim 1, wherein said gate electrode is formed by depositing a gate electrode material and planarizing said gate electrode material employing a stopping layer which is selected from the group consisting of said gate dielectric, a surface of said silicon carbide substrate, and said graphene layer.

12. The method of claim 1, wherein a field effect transistor having a portion of said second horizontal graphene layer as a channel portion is provided, and said doped source region is in contact with said first vertical graphene layer, and said drain region is in contact with said second vertical graphene layer.

13. A method of manufacturing a field effect transistor comprising:
providing a silicon carbide substrate;
forming at least one pair of sidewalls not conducive to graphitization on said silicon carbide substrate;
performing solid state graphitization on exposed surfaces of said silicon carbide substrate including said at least one pair of sidewalls, wherein a contiguous carbon-containing layer is formed on said silicon carbide substrate, said contiguous carbon-containing layer contiguously extending, in order, through a first horizontal graphene layer, a first vertical carbon layer having a structural arrangement different from a graphene layer, a second horizontal graphene layer, a second vertical carbon layer having a structural arrangement different from a graphene layer, and a third horizontal graphene layer that is coplanar with said first horizontal graphene layer, wherein said second horizontal graphene layer is vertically offset from said first and third graphene layers, and said first and second vertical graphene layer are formed by graphitization of said at least one pair of sidewalls;
forming an ion implantation blocking structure over a portion of said at least one graphene layer;
forming doped source and drain regions within said silicon carbide substrate;
removing said ion implantation blocking structure;
forming a gate dielectric over said portion of said at least one graphene layer; and
forming a gate electrode directly on said gate dielectric layer.

14. The method of claim 13, further comprising forming a trench in said silicon carbide substrate, wherein said second horizontal graphene layer contacts a substantially flat bottom surface of said trench.

15. The method of claim 14, further comprising forming a threshold voltage adjustment implant region directly underneath a bottom surface of said trench prior to forming said doped source and drain regions.

16. The method of claim 15, wherein doped regions having a same dopant concentration as said threshold voltage adjustment implant region are formed directly underneath a topmost surface of said silicon carbide substrate.

17. The method of claim 15, wherein said threshold voltage adjustment implant region contacts an entirety of said channel portion and has a same type of doping as said doped source and drain regions.

18. The method of claim 13, further comprising forming a gate spacer, wherein said gate dielectric contains at least one substantially vertical portion that abuts said gate spacer.

19. The method of claim 13, wherein said gate electrode is formed by depositing a gate electrode material and planarizing said gate electrode material employing a stopping layer which is selected from the group consisting of said gate dielectric, a surface of said silicon carbide substrate, and said graphene layer.

20. The method of claim 13, wherein a field effect transistor having a portion of said second horizontal graphene layer as a channel portion is provided, and said doped source region is in contact with said first vertical carbon layer, and said drain region is in contact with said second vertical carbon layer.

* * * * *